US012795896B2

(12) United States Patent
Lee et al.

(10) Patent No.: US 12,795,896 B2
(45) Date of Patent: Nov. 10, 2026

(54) SEMICONDUCTOR DEVICE AND METHOD OF FABRICATING THE SAME

(71) Applicant: SAMSUNG ELECTRONICS CO., LTD., Suwon-si (KR)

(72) Inventors: Hyeran Lee, Hwaseong-si (KR); Kiseok Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 916 days.

(21) Appl. No.: 17/829,446

(22) Filed: Jun. 1, 2022

(65) Prior Publication Data

US 2023/0164980 A1 May 25, 2023

(30) Foreign Application Priority Data

Nov. 24, 2021 (KR) ........................ 10-2021-0163706

(51) Int. Cl.
*H10B 12/00* (2023.01)
*H10B 61/00* (2023.01)
*H10B 63/00* (2023.01)

(52) U.S. Cl.
CPC ........... *H10B 12/34* (2023.02); *H10B 12/053* (2023.02); *H10B 12/315* (2023.02); *H10B 61/22* (2023.02); *H10B 63/30* (2023.02)

(58) Field of Classification Search
CPC .............. H10B 12/0335; H10B 12/053; H10B 12/315; H10B 12/34; H10B 12/482; H10B 12/485; H10B 61/22; H10B 63/30; H10B 63/80
See application file for complete search history.

(56) References Cited

U.S. PATENT DOCUMENTS

| | | | |
|---|---|---|---|
| 9,165,859 | B2 | 10/2015 | Lim et al. |
| 10,163,909 | B2 | 12/2018 | Wang et al. |
| 10,665,498 | B2 | 5/2020 | Kim et al. |
| 10,872,811 | B2 | 12/2020 | Chen |
| 10,930,655 | B2 | 2/2021 | Kim et al. |
| 11,018,140 | B2 | 5/2021 | Chien et al. |

(Continued)

FOREIGN PATENT DOCUMENTS

| | | |
|---|---|---|
| KR | 10-2006-0113264 A | 11/2006 |
| KR | 20170134928 A | 12/2017 |

(Continued)

*Primary Examiner* — Meiya Li
(74) *Attorney, Agent, or Firm* — Muir Patent Law, PLLC

(57) ABSTRACT

A semiconductor device includes a substrate including an active portion defined by a device isolation pattern; a word line in the substrate, the word line crossing the active portion and extending in a first direction; a bit line crossing the active portion and the word line and extending in a second direction intersecting the first direction; a first pad on an end portion of the active portion; a first contact on the first pad and adjacent to the bit line in the first direction; and an insulating separation pattern on the word line and adjacent to the first contact in the second direction, wherein the first contact includes a barrier pattern on the first pad, and a conductive pattern vertically extending from the barrier pattern, and a side surface of the conductive pattern of the first contact is in direct contact with the insulating separation pattern.

20 Claims, 28 Drawing Sheets

(56) References Cited

U.S. PATENT DOCUMENTS

| | | | | |
|---|---|---|---|---|
| 2015/0061134 | A1* | 3/2015 | Lee | H10B 12/34 257/751 |
| 2018/0175045 | A1 | 6/2018 | Lee et al. | |
| 2019/0189619 | A1 | 6/2019 | Pak et al. | |
| 2020/0203354 | A1 | 6/2020 | Lee et al. | |
| 2021/0035613 | A1 | 2/2021 | Park et al. | |
| 2021/0202492 | A1 | 7/2021 | Wang et al. | |

FOREIGN PATENT DOCUMENTS

| | | | |
|---|---|---|---|
| KR | 20180063947 | A | 6/2018 |
| KR | 20200033025 | A | 3/2020 |
| KR | 10-2022-0162019 | A | 12/2022 |
| TW | I615921 | | 2/2018 |

* cited by examiner

SEMICONDUCTOR DEVICE AND METHOD OF FABRICATING THE SAME

CROSS-REFERENCE TO RELATED APPLICATION

This U.S. non-provisional patent application claims priority under 35 U.S.C. § 119 to Korean Patent Application No. 10-2021-0163706, filed on Nov. 24, 2021, in the Korean Intellectual Property Office, the entire contents of which are hereby incorporated by reference.

BACKGROUND

1. Field

Embodiments relate to a semiconductor device and a method of fabricating the same.

2. Description of the Related Art

Due to their small-sized, multifunctional, and/or low-cost characteristics, semiconductor devices are being esteemed as important elements in the electronic industry. With the advancement of the electronic industry, there is an increasing demand for a semiconductor device with higher integration density.

SUMMARY

The embodiments may be realized by providing a semiconductor device including a substrate including an active portion defined by a device isolation pattern; a word line in the substrate, the word line crossing the active portion and extending in a first direction; a bit line crossing the active portion and the word line and extending in a second direction intersecting the first direction; a first pad on an end portion of the active portion; a first contact on the first pad and adjacent to the bit line in the first direction; and an insulating separation pattern on the word line and adjacent to the first contact in the second direction, wherein the first contact includes a barrier pattern on the first pad, and a conductive pattern vertically extending from the barrier pattern, and a side surface of the conductive pattern of the first contact is in direct contact with the insulating separation pattern.

The embodiments may be realized by providing a semiconductor device including a substrate including an active portion defined by a device isolation pattern; a word line in the substrate, the word line crossing the active portion and extending in a first direction; a bit line crossing the active portion and the word line and extending in a second direction intersecting the first direction; a bit line spacer covering a side surface of the bit line; a first contact on a center portion of the active portion and connected to the bit line; a first pad on an end portion of the active portion and spaced apart from the first contact in the first direction; a second contact on the first pad and adjacent to the bit line in the first direction; an ohmic contact layer between the first pad and the second contact; an insulating separation pattern on the word line and adjacent to the second contact in the second direction; a second pad on the second contact; and a data storage pattern on the second pad, wherein the bit line spacer includes a first spacer, a second spacer, a third spacer, and a fourth spacer sequentially stacked on the side surface of the bit line, the second contact includes a barrier pattern on the first pad, and a conductive pattern vertically extending from the barrier pattern, and a side surface of the conductive pattern of the second contact is in direct contact with the insulating separation pattern and the fourth spacer of the bit line spacer.

The embodiments may be realized by providing a method of fabricating a semiconductor device, the method including forming a device isolation pattern on a substrate to define active portions; forming word lines in the substrate to cross the active portions and to extend in a first direction; forming first pads on the active portions; partially etching the active portions and the first pads to form a first opening; forming a first contact in the first opening; forming bit lines to cross the active portions and the word lines and to extend in a second direction intersecting the first direction; sequentially forming a first spacer, a second spacer, and a third spacer on side surfaces of the bit lines; forming second contacts between the bit lines and between the word lines, the second contacts being in contact with the first pads; and forming insulating separation patterns between the second contacts, wherein each of the second contacts includes a barrier pattern formed on each of the first pads, and a conductive pattern formed on the barrier pattern, and side surfaces of the conductive pattern of each of the second contacts are in direct contact with the insulating separation patterns.

BRIEF DESCRIPTION OF THE DRAWINGS

Features will be apparent to those of skill in the art by describing in detail exemplary embodiments with reference to the attached drawings in which.

DETAILED DESCRIPTION

Figure 1A:
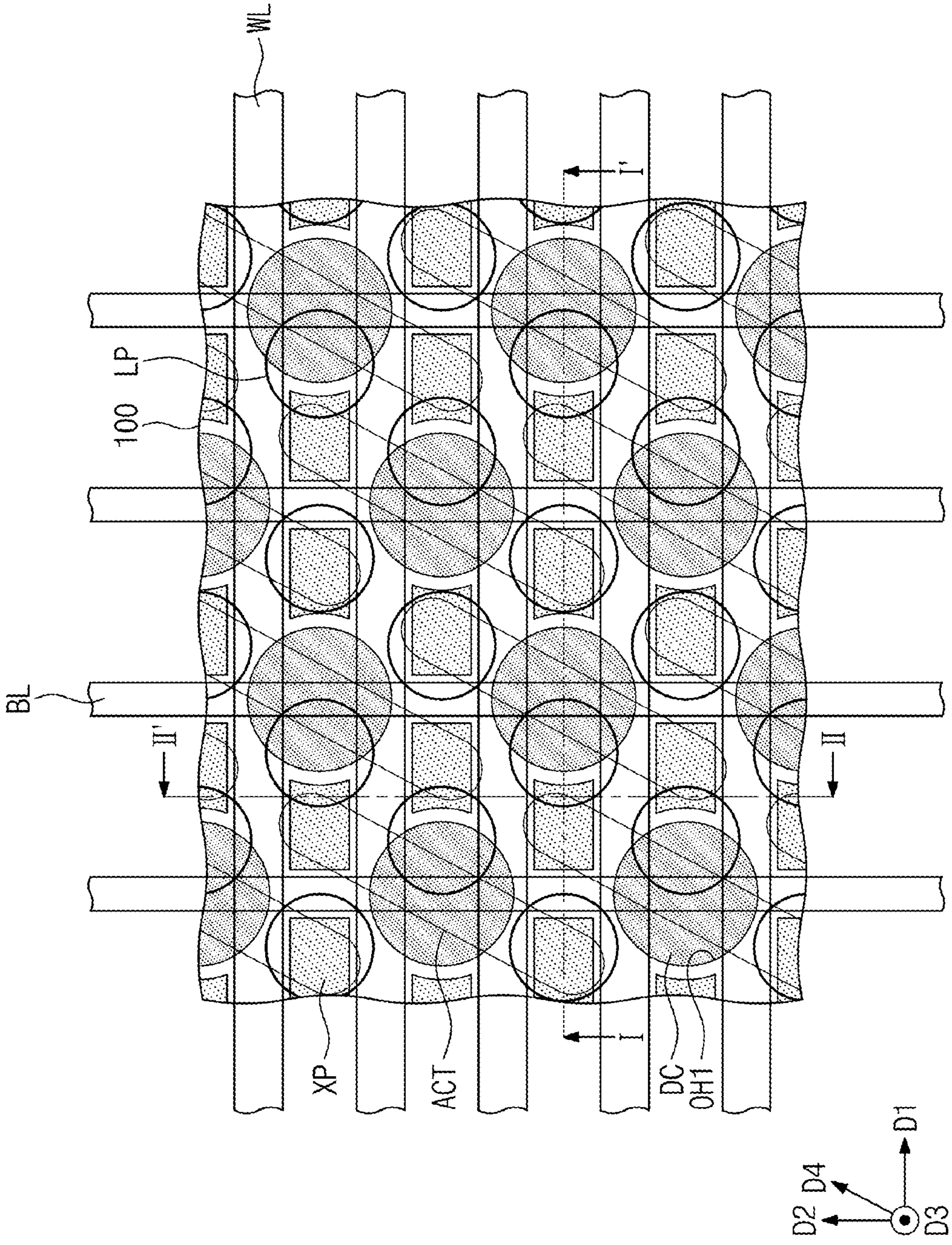
FIG. 1A is a plan view of a semiconductor device according to an embodiment.
Figure 1B:
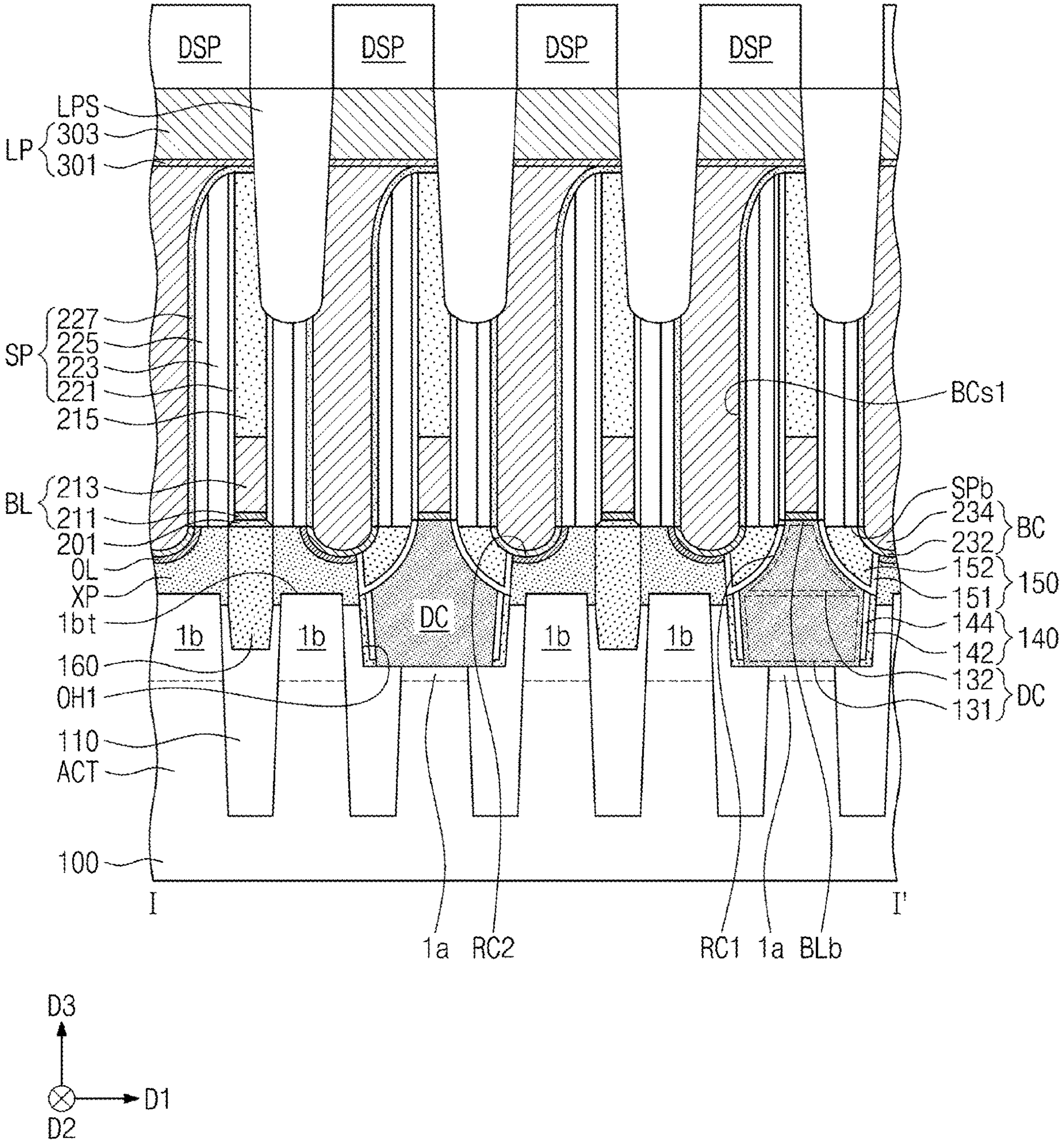
FIGS. 1B and 1C are sectional views, which are respectively taken along lines I-I' and of FIG. 1A to illustrate a semiconductor device according to an embodiment.
Figure 1C:
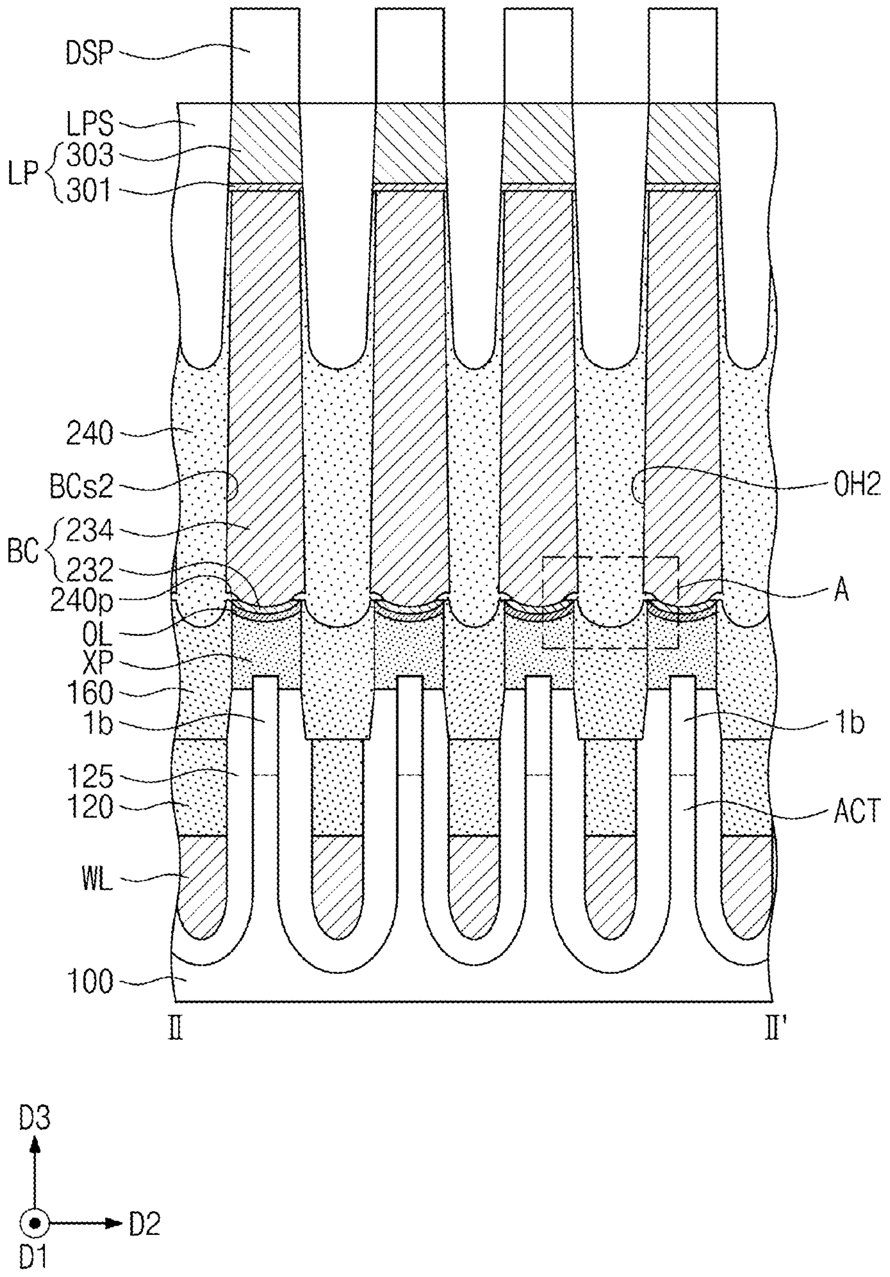

FIG. 1A is a plan view of a semiconductor device according to an embodiment. FIGS. 1B and 1C are sectional views, which are respectively taken along lines I-I' and II-II' of FIG. 1A to illustrate a semiconductor device according to an embodiment.

Referring to FIGS. 1A, 1B, and 1C, a substrate 100 including a plurality of active portions ACT may be provided. The substrate 100 may be a semiconductor substrate. In an implementation, the substrate 100 may be a silicon wafer, a silicon-germanium wafer, a germanium wafer, a silicon-on-insulator (SOI) wafer, a germanium-on-insulator (GOI) wafer, or a single crystalline epitaxial layer grown on a single-crystalline silicon wafer. The substrate 100 may extend in a first direction D1 and a second direction D2, which are not parallel to each other, and may have a top surface that is normal to a third direction D3, which are not parallel to both of the first and second directions D1 and D2. In an implementation, the first, second, and third directions D1, D2, and D3 may be orthogonal to each other.

A device isolation pattern 110 may be on the substrate 100. The device isolation pattern 110 may define the active portions ACT of the substrate 100. The device isolation pattern 110 may be formed of or include, e.g., silicon oxide, silicon nitride, or silicon oxynitride, and may have a single-layered or multi-layered structure. As used herein, the term "or" is not an exclusive term, e.g., "A or B" would include A, B, or A and B.

Each of the active portions ACT may have an isolated shape. When viewed in the plan view of FIG. 1A, each of the active portions ACT may have an elongated bar shape that extends (e.g., lengthwise) in a fourth direction D4, which is parallel to the top surface of the substrate 100 but is not parallel to either of the first and second directions D1 and D2. Each of the active portions ACT may correspond to a portion of the substrate 100 surrounded by the device isolation pattern 110. The active portions ACT may be arranged to be parallel to each other, and each of the active portions ACT may be arranged such that an end thereof is located near a center of another of the active portions ACT adjacent thereto in the first direction D1.

In an implementation, a top surface of the device isolation pattern 110 may be located at a level lower than top surfaces of the active portions ACT (e.g., in the third direction D3). Upper portions of the active portions ACT may protrude from or above the top surface of the device isolation pattern 110 in the third direction D3. The device isolation pattern 110 may expose at least a portion of a side surface of each of the active portions ACT.

Word lines WL may cross the active portions ACT and may extend in the first direction D1. The word lines WL may be spaced apart from each other in the second direction D2. Each pair of the word lines WL may cross a corresponding one of the active portions ACT. The word lines WL may be buried in the substrate 100. In an implementation, the word lines WL may have top surfaces that are located at a level lower than the top surfaces of the active portions ACT and the top surface of the device isolation pattern 110. A bottom surface of each of the word lines WL may have a curved shape. The word lines WL may include a conductive material.

Word line capping patterns 120 may be on the word lines WL. The word line capping patterns 120 on the word lines WL may extend in the first direction D1. Each of the word line capping patterns 120 may cover the entire top surface of a corresponding one of the word lines WL. In an implementation, the word line capping patterns 120 may be formed of or include, e.g., silicon nitride.

A gate dielectric layer 125 may cover bottom and side surfaces of each of the word lines WL and side surfaces of each of the word line capping patterns 120. The gate dielectric layer 125 may be between each of the word lines WL and the substrate 100 (i.e., between each of the word lines WL and the active portions ACT) and between each of the word line capping patterns 120 and the active portions ACT. A top surface of the gate dielectric layer 125 may be at a level lower than the top surfaces of the active portions ACT. In an implementation, the top surface of the gate dielectric layer 125 may be located at substantially the same level as the top surface of the device isolation pattern 110. The gate dielectric layer 125 may be formed of or include, e.g., silicon oxide, silicon nitride, silicon oxynitride, or high-k dielectric materials.

A first impurity region 1*a* may be in a center portion of each active portion ACT, which is between the paired word lines WL. A pair of second impurity regions 1*b* may be at or on opposite end portions of each active portion ACT. Each of the first and second impurity regions 1*a* and 1*b* may have a conductivity type different from the substrate 100. In the case where the substrate 100 has a first conductivity type (e.g., p-type), each of the first and second impurity regions 1*a* and 1*b* may have a second conductivity type (e.g., n-type) that is different from the first conductivity type. In an implementation, the first impurity region 1*a* may correspond to a common drain region, and the second impurity regions 1*b* may correspond to source regions.

The word lines WL and the first and second impurity regions 1*a* and 1*b* adjacent thereto may constitute transistors. The word lines WL may be buried in the substrate 100, and it may be possible to increase a channel length of the transistor formed within a limited area and hence to suppress or minimize a short channel effect.

A first contact DC may be on the first impurity region 1*a* of each of the active portions ACT. The first contact DC may be in a first opening OH1 to cover a bottom surface of the first opening OH1. The first contact DC may electrically connect the first impurity region 1*a* to one of bit lines BL to be described below. The first contact DC may have a circular or elliptical shape, when viewed in the plan view of FIG. 1A. An area of the first contact DC may be larger than an overlapping area between one of the bit lines BL and the first impurity region 1*a*, which are overlapped with each other in the vertical direction (i.e., the third direction D3).

The first contact DC may include a first portion 131 and a second portion 132 on the first portion 131. In an implementation, as a distance in the third direction D3 (i.e., from the substrate 100) increases, the first portion 131 and the second portion 132 may have an increasing width and a decreasing width, respectively. An upper width of the first contact DC (i.e., an upper width of the second portion 132) may be smaller than its lower width (i.e., a lower width of the first portion 131). In an implementation, the upper width of the first contact DC may be substantially equal to a lower width of one of the bit lines BL, and the lower width of the first contact DC may be larger than an upper width of each of the active portions ACT. At least a portion of a bottom surface of the first contact DC may be in contact with the device isolation pattern 110. In an implementation, the first contact DC may be formed of or include, e.g., doped poly silicon.

A contact insulating structure 140 may be on an inner side surface of the first opening OH1 to enclose the first portion 131 of the first contact DC. The contact insulating structure 140 may be an annular or doughnut-shaped structure enclosing the first portion 131 of the first contact DC, when viewed in the plan view of FIG. 1A. A bottom surface of the contact insulating structure 140 may be substantially coplanar with the bottom surface of the first contact DC. The first contact DC may be spaced apart from the second impurity regions 1*b*, which are placed near the same in the first direction D1, with the contact insulating structure 140 interposed therebetween.

The contact insulating structure 140 may include a first contact insulating pattern 142, which is on the inner side surface of the first opening OH1, and a second contact insulating pattern 144, which is between the first contact insulating pattern 142 and the first contact DC. The first contact insulating pattern 142 may extend from the inner side surface of the first opening OH1 along the bottom surface of the first opening OH1 and may be in contact with the device isolation pattern 110. The second contact insulating pattern 144 may be surrounded by the first contact insulating pattern 142 and may be spaced apart from the device isolation pattern 110. The first and second contact insulating patterns 142 and 144 may be formed of or include different insulating materials from each other. In an implementation, the first contact insulating pattern 142 may be formed of or include, e.g., silicon nitride, the second contact insulating pattern 144 may be formed of or include, e.g., silicon oxide.

A gapfill insulating structure 150 may be in the first opening OH1 to enclose the second portion 132 of the first contact DC. The gapfill insulating structure 150 may be a doughnut-shaped structure enclosing the second portion 132 of the first contact DC, when viewed in the plan view of FIG. 1A. The gapfill insulating structure 150 may be in a first recess portion RC1. The first contact DC may be spaced apart from first pads XP and second contacts BC, which may be near the same in the first direction D1, with the gapfill insulating structure 150 therebetween.

The gapfill insulating structure 150 may include a first gapfill insulating pattern 151, which may conformally cover an inner side surface of the first recess portion RC1 (i.e., the inner side surface of the first opening OH1 and a side surface of the second portion 132 of the first contact DC), and a second gapfill insulating pattern 152, which may fill a space defined by the first gapfill insulating pattern 151. The first and second gapfill insulating patterns 151 and 152 may fully fill the first recess portion RC1. The first gapfill insulating pattern 151 may cover a top surface of the contact insulating structure 140. The first and second gapfill insulating patterns 151 and 152 may be formed of or include insulating materials different from each other. In an implementation, the first gapfill insulating pattern 151 may be formed of or include, e.g., silicon oxide, the second gapfill insulating pattern 152 may be formed of or include, e.g., silicon nitride.

The first contact DC, the contact insulating structure 140, and the gapfill insulating structure 150 may fully fill the first opening OH1. The contact insulating structure 140 and the gapfill insulating structure 150 may help suppress an interference issue between the first contact DC and the first pads XP and between the first contact DC and the second contacts BC.

The first pads XP may be on the second impurity regions 1*b* of each of the active portions ACT. The first pads XP may electrically connect the second impurity regions 1*b* to the second contacts BC. Each of the first pads XP may have a shape similar to a rectangle, when viewed in the plan view of FIG. 1A. In each of the first pads XP, a side surface adjacent to the first contact DC may be recessed in a direction away from the first contact DC (i.e., in the first direction D1 or in an opposite direction thereof). An area of each of the first pads XP may be larger than an overlapping area between one of the second impurity regions 1*b* and one of the second contacts BC, which are overlapped with each other in the third direction D3 (i.e., vertically), and may be larger than an area of a top surface of each of the second impurity regions 1*b*.

At least a portion of a top surface of each of the first pads XP may be recessed. The recessed top surface of each of the first pads XP may have a concavely curved shape. At least a portion of a bottom surface of each of the first pads XP may be located at a level lower than top surfaces 1*bt* of the second impurity regions 1*b*. In an implementation, each of the first pads XP may cover a portion of the side surface of each of the active portions ACT. A portion of the bottom surface of each of the first pads XP may be in contact with the top surface of the device isolation pattern 110. Another portion of the bottom surface of each of the first pads XP may be in contact with the top surface of the gate dielectric layer 125 on a side surface of each of the word lines WL. In an implementation, the bottom surface of each of the first pads XP may be substantially coplanar with the top surfaces 1*bt* of the second impurity regions 1*b*. Ones of the first pads XP, which are adjacent to the first contact DC, may be spaced apart from the first contact DC with the contact insulating structure 140 and the gapfill insulating structure 150 interposed therebetween.

An ohmic contact layer OL may be between each of the first pads XP and each of the second contacts BC. Due to the ohmic contact layer OL, the first pads XP may have an ohmic contact property, when they are connected to the second contacts BC. The ohmic contact layer OL may be on the recessed top surface of each of the first pads XP. A bottom surface of the ohmic contact layer OL may have a shape that is curved along the recessed top surface of each of the first pads XP (e.g., in a complementary manner). A top surface of the ohmic contact layer OL may have a curved shape, like a bottom surface of a second recess portion RC2 to be described below. In an implementation, the ohmic contact layer OL may be formed of or include, e.g., a metal silicide material (e.g., cobalt silicide).

First insulating separation patterns 160 may be between the first pads XP. Some of the first insulating separation patterns 160 may be between the device isolation pattern 110 and the bit lines BL to separate the first pads XP from each other in the first direction D1, and others of the first insulating separation patterns 160 may be between the word line capping patterns 120 and second insulating separation patterns 240, which will be described below, to separate the first pads XP from each other in the second direction D2. Some of the first insulating separation patterns 160 may extend in the third direction D3 and may be partially inserted into the device isolation pattern 110, and in this case, bottom surfaces thereof may be located at a level lower than the top surface of the device isolation pattern 110. Others of the first insulating separation patterns 160 may have bottom surfaces that are located at a level lower than the top surface of the gate dielectric layer 125 and are in contact with top surfaces of the word line capping patterns 120. The first insulating separation patterns 160 may be formed of or include, e.g., silicon oxide, silicon nitride, or silicon oxynitride.

The bit lines BL may extend in the second direction D2 to cross the active portions ACT and the word lines WL. The bit lines BL may be spaced apart from each other in the first direction D1. Each of the bit lines BL may be on the first impurity region 1*a* of a corresponding one of the active portions ACT and may be in contact with the first contact DC. Each of the bit lines BL may include a first barrier pattern 211 and a first conductive pattern 213, which are sequentially stacked.

Each of the bit lines BL may extend from the first impurity region 1*a* of each of the active portions ACT into regions between the first pads XP, when viewed in the plan view of FIG. 1A. Each of the bit lines BL may be on the first insulating separation patterns 160 and between the first pads XP. Buffer insulating patterns 201 may be between each of the bit lines BL and the first insulating separation patterns 160. In an implementation, the buffer insulating patterns 201 may be formed of or include, e.g., silicon nitride.

In an implementation, each of the bit lines BL may further include a poly silicon pattern below the first barrier pattern 211. The first barrier pattern 211 may be formed of or include, e.g., titanium, titanium nitride, titanium silicon nitride, tantalum, tantalum nitride, or tungsten nitride. The first conductive pattern 213 may be formed of or include a metallic material (e.g., tungsten, aluminum, copper, ruthenium, or iridium).

Bit line capping patterns 215 may be on the bit lines BL. The bit line capping patterns 215 may extend in the second direction D2 on the bit lines BL. Each of the bit line capping patterns 215 may cover the entire top surface of a corresponding one of the bit lines BL. In an implementation, the bit line capping patterns 215 may be formed of or include silicon nitride.

Bit line spacers SP may cover side surfaces of the bit lines BL and side surfaces of the bit line capping patterns 215 and may extend in the second direction D2 or along the bit lines BL and the bit line capping patterns 215. Each of the bit line spacers SP may be between the bit lines BL and the second contacts BC. Each of the bit line spacers SP may include a first spacer 221, a second spacer 223, a third spacer 225, and a fourth spacer 227, which are sequentially stacked in a direction away from the side surfaces of the bit lines BL and the side surfaces of the bit line capping patterns 215. Adjacent ones of the first to third spacers 221, 223, and 225 may include different insulating materials from each other. In an implementation, one of the first to fourth spacers 221, 223, 225, and 227 may be an air layer or an air gap.

The first spacer 221 may be in direct contact with the side surfaces of the bit lines BL and the side surfaces of the bit line capping patterns 215. On the first contact DC, a portion of a bottom surface of the first spacer 221 may be in contact with the first gapfill insulating pattern 151 of the gapfill insulating structure 150. In an implementation, an outer side surface of the first spacer 221 may be aligned to a side surface of the first gapfill insulating pattern 151 (hereinafter, an outer side surface of a spacer means a side surface of the spacer in a direction away from the side surfaces of the bit lines BL). One each of the first insulating separation patterns 160, another portion of the bottom surface of the first spacer 221 may be in contact with each of the buffer insulating patterns 201. In an implementation, the first spacer 221 may be formed of or include silicon nitride.

The second spacer 223 may be between the first spacer 221 and the third spacer 225. On the first contact DC, a portion of a bottom surface of the second spacer 223 may be in contact with the second gapfill insulating pattern 152 of the gapfill insulating structure 150. Another portion of the bottom surface of the second spacer 223 may be in contact with the first pads XP. The second spacer 223 may include a material having an etch selectivity with respect to the first spacer 221 and the third spacer 225. In an implementation, the second spacer 223 may be formed of or include silicon oxide. In an implementation, the second spacer 223 may be an air layer or an air gap.

The third spacer 225 may be between the second spacer 223 and the fourth spacer 227. On the first contact DC, a portion of a bottom surface of the third spacer 225 may be in contact with the second gapfill insulating pattern 152 of the gapfill insulating structure 150. In an implementation, an outer side surface of the third spacer 225 may be aligned to a side surface of the second gapfill insulating pattern 152. Another portion of the bottom surface of the third spacer 225 may be in contact with the first pads XP and the ohmic contact layer OL. In an implementation, the outer side surface of the third spacer 225 may be aligned to or with a side surface of the ohmic contact layer OL (i.e., an inner side surface of the second recess portion RC2). The third spacer 225 may include a material having an etch selectivity with respect to the second spacer 223 and the fourth spacer 227. In an implementation, the third spacer 225 may be formed of or include silicon nitride.

The fourth spacer 227 may be between the third spacer 225 and a second conductive pattern 234 (to be described below) of each of the second contacts BC. In an implementation, the fourth spacer 227 may extend from the outer side surface of the third spacer 225 along top surfaces of the first to third spacers 221, 223, and 225 and a top surface of each of the bit line capping patterns 215. A bottom surface of the fourth spacer 227 may be in contact with a second barrier pattern 232 (to be described below) of each of the second contacts BC. In an implementation, an outer side surface of the fourth spacer 227 may extend along a side surface of the second conductive pattern 234 of each of the second contacts BC in the third direction D3 and may be aligned to or with a side surface of the second barrier pattern 232 of each of the second contacts BC. In an implementation, the fourth spacer 227 may include an insulating material different from the third spacer 225. In an implementation, the fourth spacer 227 may be formed of or include silicon oxide or silicon oxycarbide. In an implementation, the fourth spacer 227 may be an air layer. In an implementation, the fourth spacer 227 may include the same insulating material as the third spacer 225. In an implementation, the fourth spacer 227 may be formed of or include silicon nitride.

The fourth spacer 227 may be connected to the second insulating separation patterns 240, which are adjacent thereto in the second direction D2. In an implementation, the fourth spacer 227 may be formed of or include the same insulating material as the second insulating separation patterns 240.

The second contacts BC may be between the word lines WL, which are adjacent to each other in the second direction D2, and between the bit lines BL, which are adjacent to each other in the first direction D1. Each of the second contacts BC may extend on or from a corresponding one of the first pads XP in the third direction D3. When viewed in the sectional view of FIG. 1B, each of the second contacts BC may have first side surfaces BCs1 that are in direct contact with the bit line spacers SP. In an implementation, each of the first side surfaces BCs1 may be in contact with the fourth spacer 227 of each of the bit line spacers SP. When viewed in the sectional view of FIG. 1C, each of the second contacts BC may have second side surfaces BCs2 that are in direct contact with each of the second insulating separation patterns 240. In an implementation, the first side surfaces BCs1 may be side surfaces of the second contacts BC that are substantially normal to the first direction D1, and the second side surfaces BCs2 may be side surfaces of the second contacts BC that are substantially normal to the second direction D2.

A bottom surface of each of the second contacts BC may have a curved shape protruding (e.g., downwardly convex) toward the substrate 100 and may be in contact with each of the first pads XP. A top surface of each of the second contacts BC may be substantially coplanar with the uppermost surface of the fourth spacer 227.

Each of the second contacts BC may include the second barrier pattern 232, which is in contact with a corresponding one of the first pads XP, and the second conductive pattern 234, which is on the second barrier pattern 232. The second barrier pattern 232 may extend along the bottom surface of the second recess portion RC2 to conformally cover a top surface of the ohmic contact layer OL and a portion of a top surface of the gapfill insulating structure 150. The second barrier pattern 232 may be in contact with the fourth spacer 227 and one of protruding portions 240*p* of each of the second insulating separation patterns 240. The second barrier pattern 232 may not be between the third spacer 225 and the second conductive pattern 234 and between each of the second insulating separation patterns 240 and the second conductive pattern 234. In an implementation, the second barrier pattern 232 may be locally at a level that is lower than bottom surfaces BLb of the bit lines BL and bottom surfaces SPb of the bit line spacers SP. In this case, it may be possible to help reduce a parasitic capacitance between the bit lines BL, without a reduction in a contact area between each of the second contacts BC and each of the first pads XP, and hence to improve electrical characteristics and reliability of the semiconductor device.

A bottom surface of the second conductive pattern 234 may have a shape that is curved along a top surface of the second barrier pattern 232. The bottom surface of the second conductive pattern 234 may be at a level lower than the bottom surfaces BLb of the bit lines BL and lower than the bottom surfaces SPb of the bit line spacers SP. The second barrier pattern 232 may cover the bottom surface of the second conductive pattern 234.

The second barrier pattern 232 may be formed of or include, e.g., titanium, titanium nitride, titanium silicon nitride, tantalum, tantalum nitride, or tungsten nitride. The second conductive pattern 234 may include a material different from the first contact DC. The second conductive pattern 234 may be formed of or include a metallic material (e.g., tungsten, aluminum, copper, ruthenium, and iridium).

Second openings OH2 may be between the bit lines BL, which are adjacent to each other in the first direction D1, and the second insulating separation patterns 240 may be in the second openings OH2. When viewed in the plan view of FIG. 1A, the second insulating separation patterns 240 may be between the first pads XP, which are adjacent to each other in the second direction D2. The second insulating separation patterns 240 may be in contact with the second side surfaces BCs2 of the second contacts BC. Each of the second insulating separation patterns 240 may be overlapped with a corresponding one of the word lines WL in the third direction D3 (i.e., vertically) and may be on a corresponding one of the first insulating separation patterns 160. Bottom surfaces of the second insulating separation patterns 240 may be located at a level lower than the bottom surfaces of the second contacts BC. In an implementation, the bottom surfaces of the second insulating separation patterns 240 may be located at a level lower than the top surfaces of the first pads XP. As a distance in the third direction D3 increases, a width of each of the second insulating separation patterns 240 may increase. The second insulating separation patterns 240 may be formed of or include, e.g., silicon oxide, silicon nitride, or silicon oxynitride.

In an implementation, the second insulating separation patterns 240 may help prevent or suppress a bridge pattern (e.g., a short circuit) from being formed between the second contacts BC, and thus, it may be possible to improve electrical characteristics and reliability of the semiconductor device.

Second pads LP may be on the second contacts BC, respectively. When viewed in the plan view of FIG. 1A, the second pads LP may be spaced apart from each other and may have an isolated island shape. In an implementation, six second pads LP, which are placed around one of the second pads LP, may be arranged to form a hexagonal shape. In an implementation, the second pads LP may be arranged to form a honeycomb shape. A bottom surface of each of the second pads LP may be substantially flat. The bottom surface of each of the second pads LP may be in contact with the second conductive pattern 234 of each of the second contacts BC and the fourth spacer 227 of each of the bit line spacers SP. The bottom surface of each of the second pads LP may be in contact with at least a portion of the second insulating separation patterns 240.

Each of the second pads LP may include a third barrier pattern 301 on the second conductive pattern 234 of each of the second contacts BC, and a third conductive pattern 303 on the third barrier pattern 301. The third barrier pattern 301 may be formed of or include, e.g., titanium, titanium nitride, titanium silicon nitride, tantalum, tantalum nitride, or tungsten nitride. The third conductive pattern 303 may be formed of or include a metallic material (e.g., tungsten, aluminum, copper, ruthenium, or iridium).

A third insulating separation pattern LPS may be between adjacent ones of the second pads LP. The third insulating separation pattern LPS may define the second pads LP. A top surface of the third insulating separation pattern LPS may be substantially coplanar with top surfaces of the second pads LP. The third insulating separation pattern LPS may face side surfaces of the second pads LP or to enclose the second pads LP and may extend to a level lower than bottom surfaces of the second pads LP. A bottom surface of the third insulating separation pattern LPS may be located at a level between top surfaces of the bit lines BL and the bottom surfaces of the second pads LP. In the case where the second spacer 223 or the fourth spacer 227 are the air layers, at least a portion of the third insulating separation pattern LPS may protrude in the third direction D3. The third insulating separation pattern LPS may be formed of or include, e.g., silicon oxide, silicon nitride, or silicon oxynitride.

Data storage patterns DSP may be on the second pads LP, respectively. In an implementation, each of the data storage patterns DSP may be a capacitor including a bottom electrode, a dielectric layer, and a top electrode. In this case, the semiconductor device may be a dynamic random access memory (DRAM) device. In an implementation, each of the data storage patterns DSP may include a magnetic tunnel junction pattern. In this case, the semiconductor device may be a magnetic random access memory (MRAM) device. In an implementation, the data storage patterns DSP may include a phase change material or a variable resistance material. In this case, the semiconductor device may be a phase-change random access memory (PRAM) device or a resistive random access memory (ReRAM) device. In an implementation, each of the data storage patterns DSP may include various structures or materials which may be used to store data.

Figure 2:
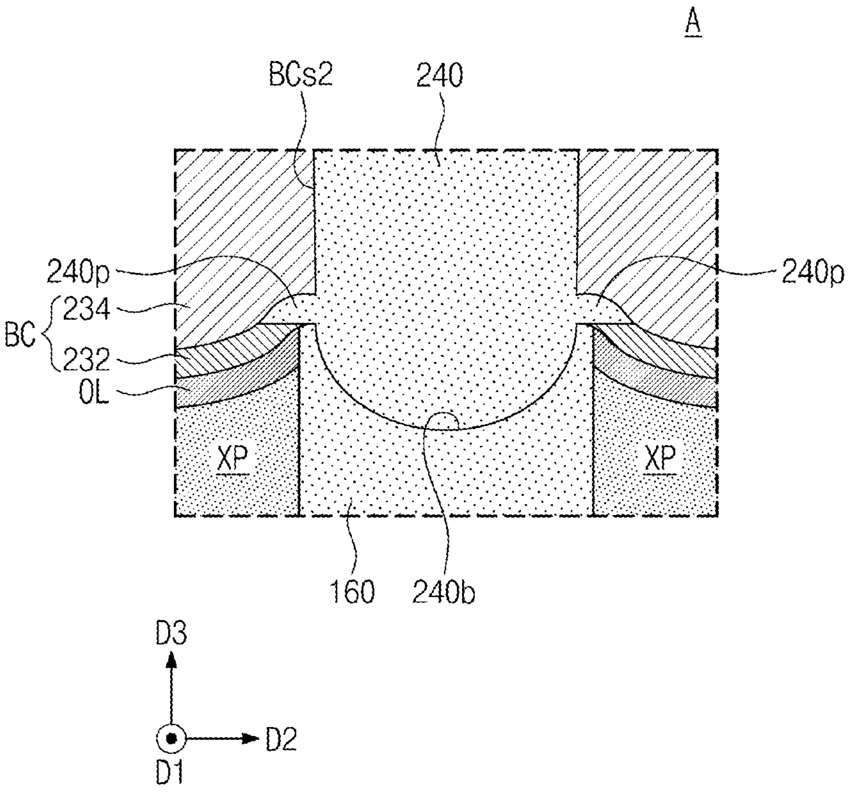
FIG. 2 is an enlarged sectional view of a portion (e.g., A of FIG. 1C) of a semiconductor device according to an embodiment.

FIG. 2 is an enlarged sectional view of a portion (e.g., A of FIG. 1C) of a semiconductor device according to an embodiment.

Referring to FIG. 2, one of the second insulating separation patterns 240 is illustrated. The description that follows will refer to one of the second insulating separation patterns 240, but the others of the second insulating separation patterns 240 may be configured to have substantially the same features as those to be described below.

The second insulating separation pattern 240 may include protruding portions 240*p*, which (e.g., laterally) protrude from its side surface (e.g., relative to the second side surfaces BCs2 of each of the second contacts BC) in a horizontal direction (e.g., the second direction D2 and an opposite direction thereof). Each of the protruding portions 240*p* may be overlapped with the second conductive pattern 234 of each of the second contacts BC in the third direction D3 (i.e., vertically). Each of the protruding portions 240*p* may be in contact (e.g., direct contact) with the second barrier pattern 232 of each of the second contacts BC. In an implementation, each of the protruding portions 240*p* may be in contact (e.g., direct contact) with the ohmic contact layer OL.

A bottom surface 240*b* of the second insulating separation pattern 240 may be located at a level lower than the bottom surfaces of the second contacts BC. In an implementation, the bottom surface 240*b* of the second insulating separation pattern 240 may be located at a level lower than the top surfaces of the first pads XP.

Figure 3:
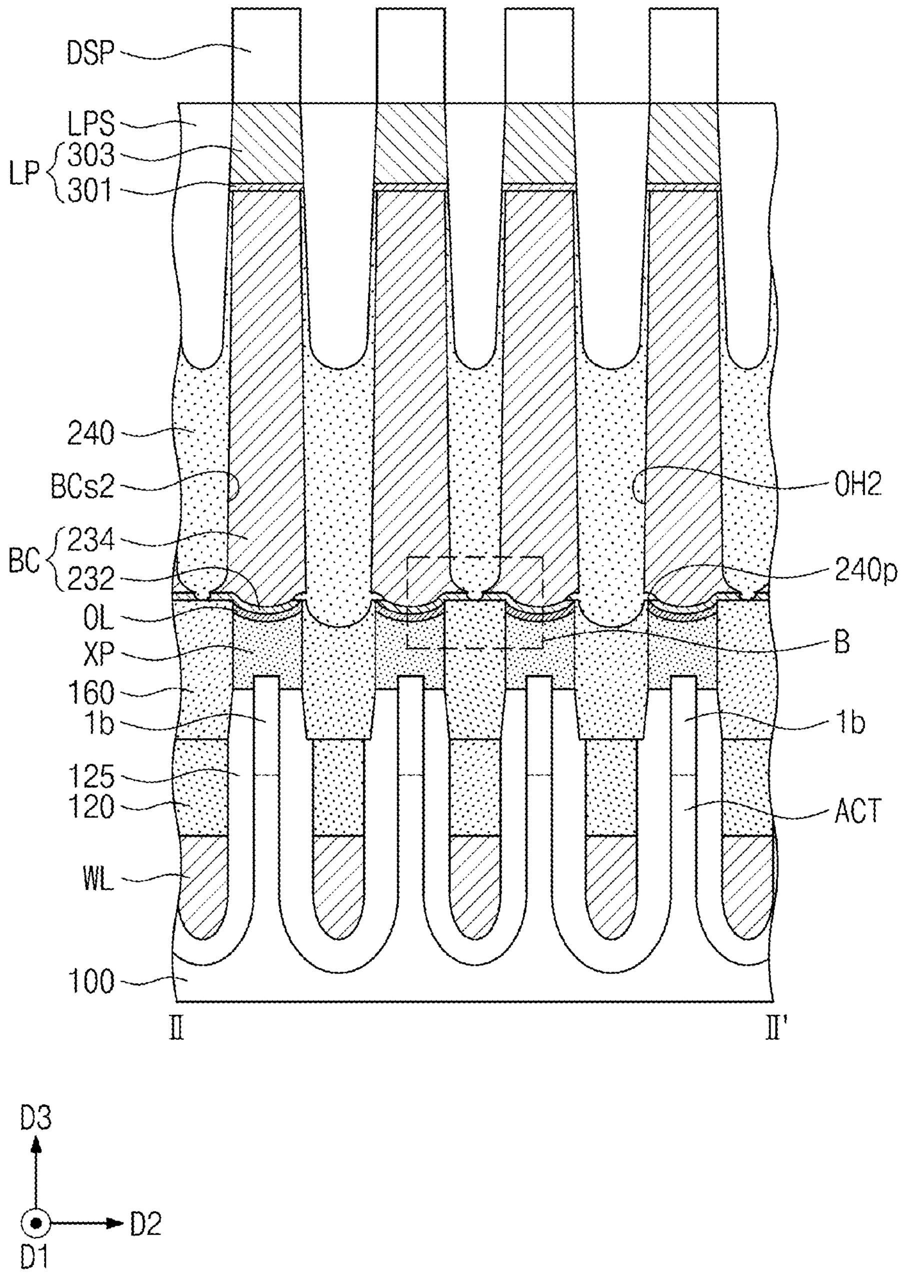
FIG. 3 is a sectional view, which is taken along the line II-II' of FIG. 1A to illustrate a semiconductor device according to an embodiment.
Figure 4:
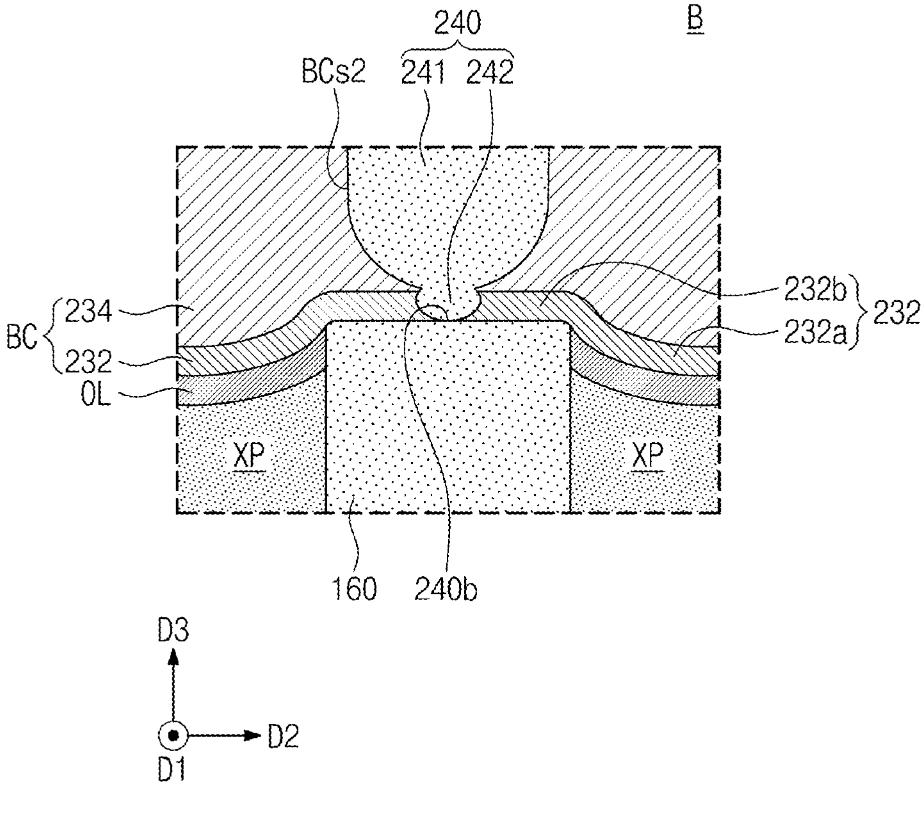
FIG. 4 is an enlarged sectional view of a portion (e.g., B of FIG. 3) of a semiconductor device according to an embodiment.

FIG. 3 is a sectional view, which is taken along the line II-II' of FIG. 1A to illustrate a semiconductor device according to an embodiment. FIG. 4 is an enlarged sectional view of a portion (e.g., B of FIG. 3) of a semiconductor device according to an embodiment. For concise description, an element previously described with reference to FIGS. 1A, 1B, 1C, and 2 may be identified by the same reference number without repeating an overlapping description thereof.

Referring to FIGS. 3 and 4, at least one of the second insulating separation patterns 240 may include a first portion 241, which extends along a side surface of the second conductive pattern 234 of each of the second contacts BC (i.e., the second side surface BCs2) in the third direction D3, and a second portion 242 below the first portion 241 and in contact with a side surface of the second barrier pattern 232 of each of the second contacts BC. A width (e.g., in the second direction D2) of the second portion 242 may be smaller than a width of the first portion 241 (e.g., in the second direction D2).

The bottom surface 240*b* of the second insulating separation pattern 240, which is defined as a bottom surface of the second portion 242, may be in contact (e.g., direct contact) with a top surface of the first insulating separation pattern 160. The bottom surface 240*b* of the second insulating separation pattern 240 may be located at a level higher than the top surfaces of the first pads XP and the bottom surfaces of the second contacts BC. The bottom surface 240*b* of the second insulating separation pattern 240 may have a curved shape.

The second barrier pattern 232 and the second conductive pattern 234 may extend toward a region below the first portion 241 and may be partially between the first portion 241 and the first insulating separation pattern 160.

The second barrier pattern 232 may include a first portion 232*a* on the ohmic contact layer OL and a second portion 232*b*, which is connected to the first portion 232*a* and extends to a region on the first insulating separation pattern 160. The second portion 232*b* of the second barrier pattern 232 may cover a portion of a side surface of the second portion 242. The second portion 232*b* of the second barrier pattern 232 may be between the first portion 241 and the first insulating separation pattern 160.

FIGS. 5A, 6A, 7A, 8A, 11A, 13A, and 15A are plan views of stages in a method of fabricating a semiconductor device, according to an embodiment. FIGS. 5B, 6B, 7B, 8B, 9, 10, 11B, 12A, 13B, 14A, and 15B are sectional views, each of which is taken along a line I-I' of a corresponding one of FIGS. 5A, 6A, 7A, 8A, 11A, 13A, and 15A to illustrate stages in a method of fabricating a semiconductor device according to an embodiment. FIGS. 5C, 6C, 12B, 13C, 14B, and 15C are sectional views, each of which is taken along a line of a corresponding one of FIGS. 5A, 6A, 7A, 8A, 11A, 13A, and 15A to illustrate stages in a method of fabricating a semiconductor device according to an embodiment.

Hereinafter, a method of fabricating a semiconductor device according to an embodiment will be described in more detail with reference to FIGS. 5A to 15C.

Figure 5A:
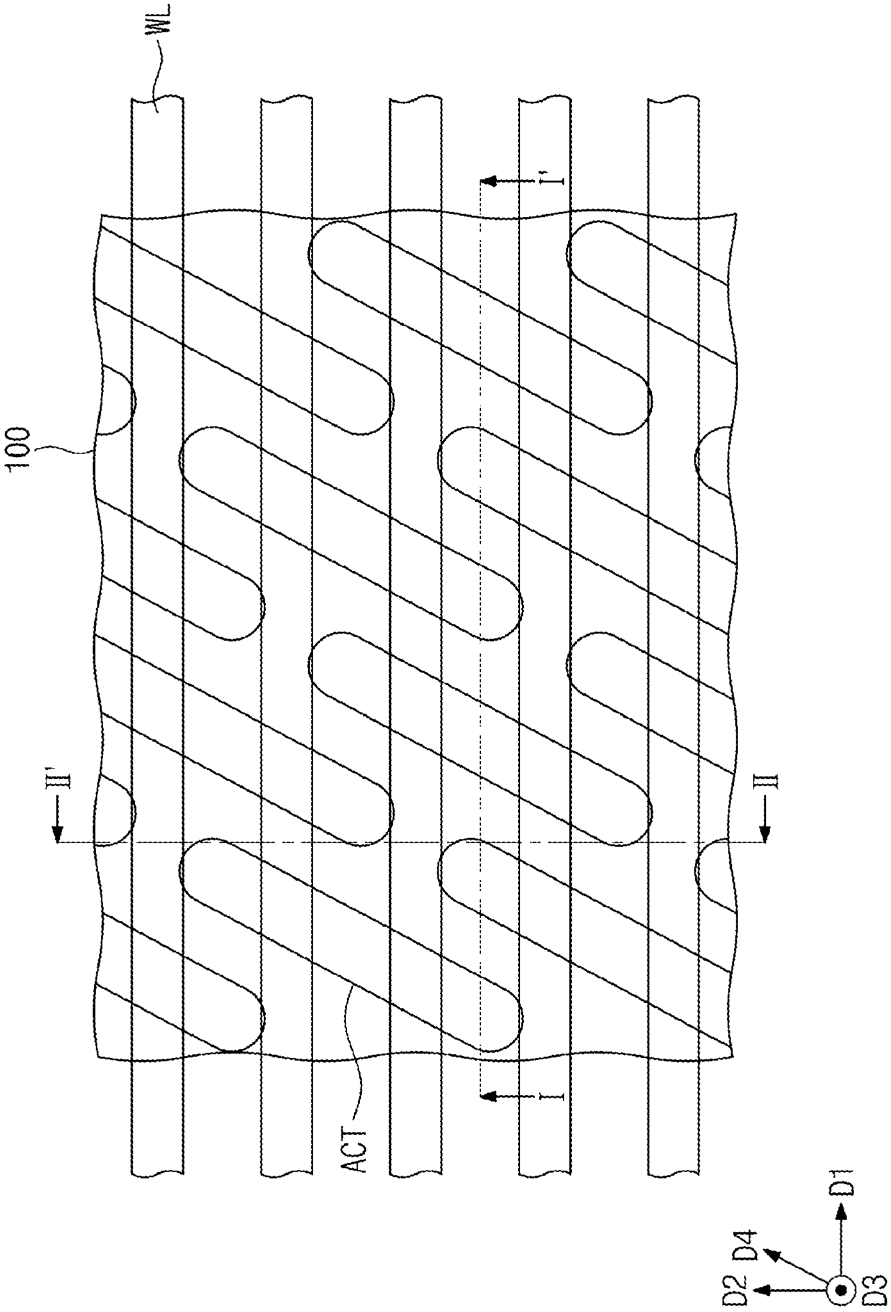
FIGS. 5A, 6A, 7A, 8A, 11A, 13A, and 15A are plan views of stages in a method of fabricating a semiconductor device, according to an embodiment.
Figure 5B:
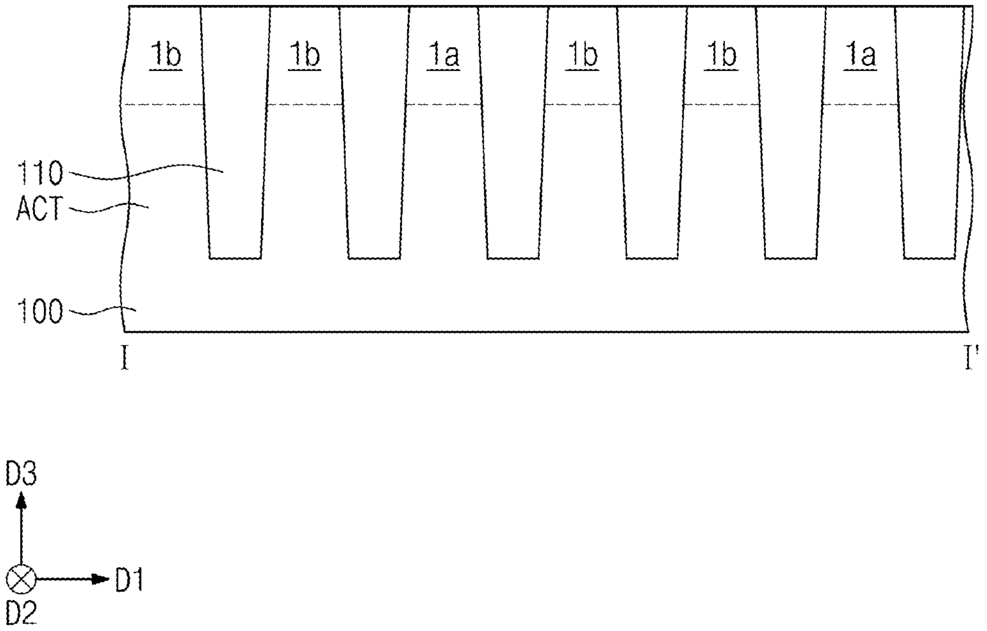
FIGS. 5B, 6B, 7B, 8B, 9, 10, 11B, 12A, 13B, 14A, and 15B are sectional views, each of which is taken along a line I-I' of a corresponding one of FIGS. 5A, 6A, 7A, 8A, 11A, 13A, and 15A to illustrate stages in a method of fabricating a semiconductor device according to an embodiment.
Figure 5C:
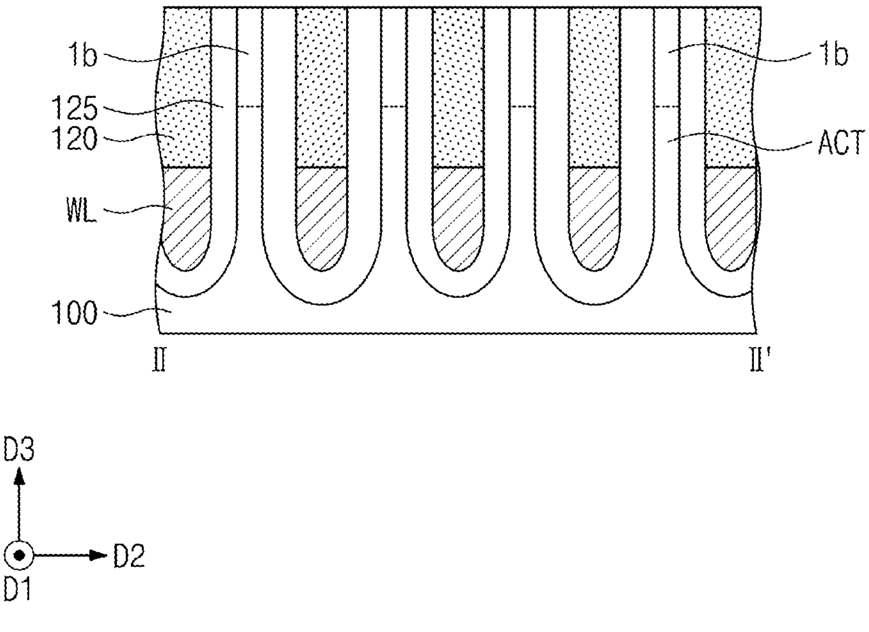
FIGS. 5C, 6C, 12B, 13C, 14B, and 15C are sectional views, each of which is taken along a line II-II' of a corresponding one of FIGS. 5A, 6A, 7A, 8A, 11A, 13A, and 15A to illustrate stages in a method of fabricating a semiconductor device according to an embodiment.

Referring to FIGS. 5A, 5B, and 5C, a device isolation pattern 110 may be formed on a substrate 100. The device isolation pattern 110 may be formed to define active portions ACT. The formation of the device isolation pattern 110 may include etching a portion of the substrate 100 to form a device isolation trench and filling the device isolation trench with an insulating material.

Thereafter, the active portions ACT of the substrate 100 and the device isolation pattern 110 may be patterned to form grooves. A gate dielectric layer 125 may be formed to conformally cover the grooves. Next, a gate conductive layer may be formed to fill the grooves, and then, an etch-back process may be performed on the gate conductive layer to form word lines WL. Next, word line capping patterns 120 may be formed on the word lines WL to fill remaining portions of the grooves.

First and second impurity regions 1*a* and 1*b* may be formed in the active portions ACT by injecting impurities into the active portions ACT using the device isolation pattern 110 and the word line capping patterns 120 as a mask or using an additional ion injection mask.

Figure 6A:
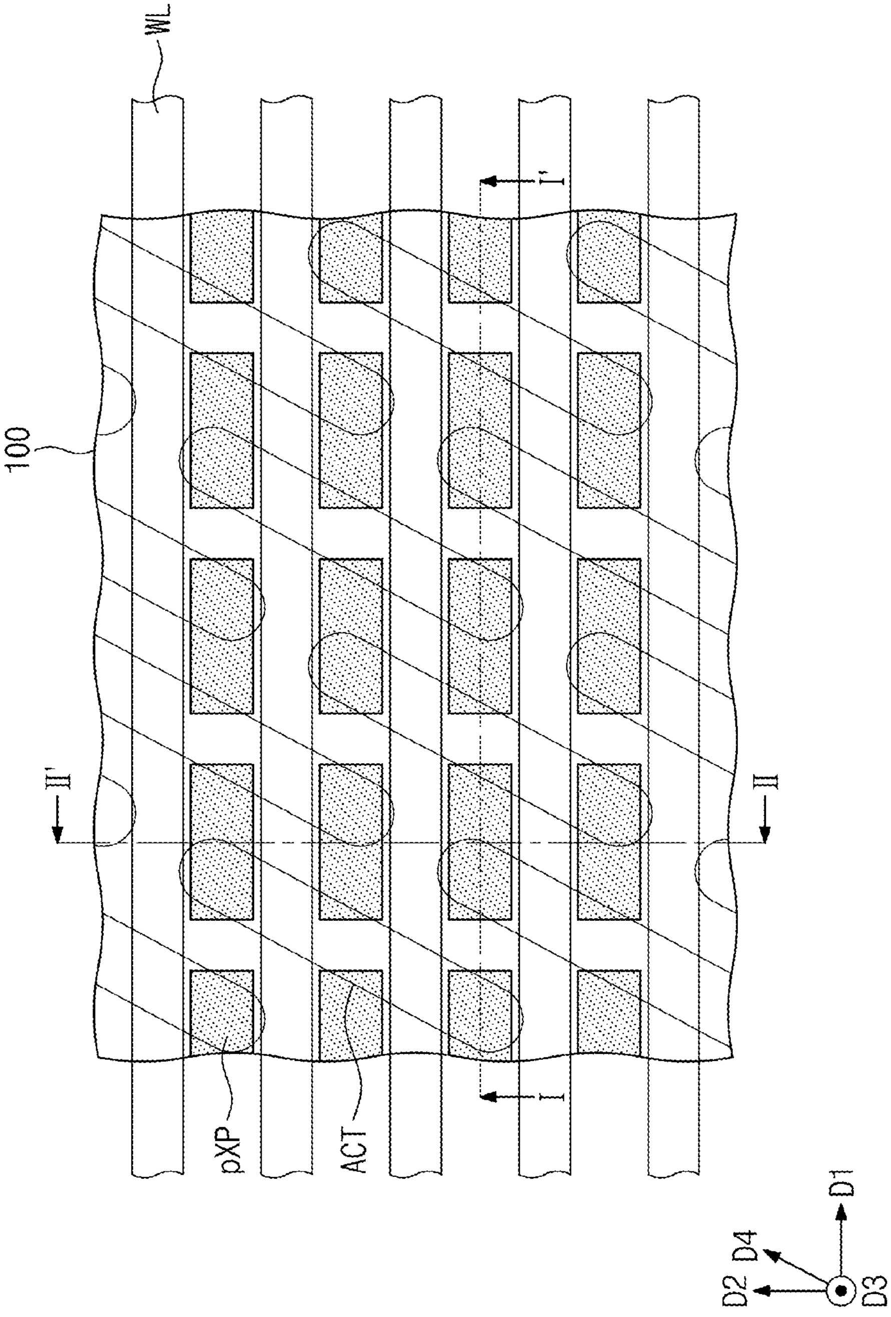
Figure 6B:
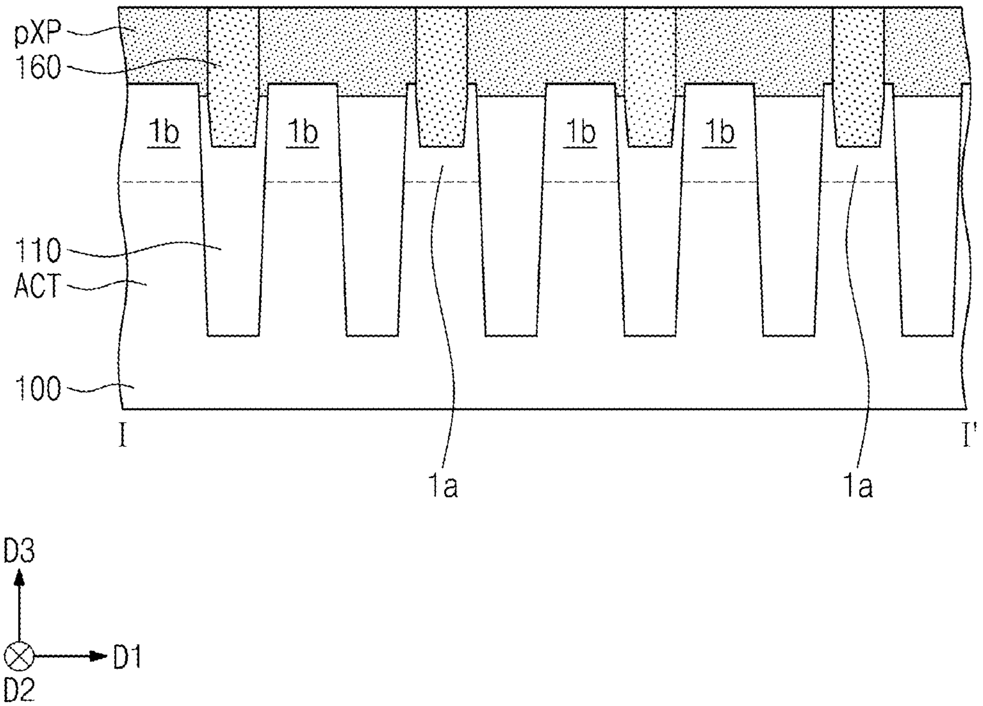
Figure 6C:
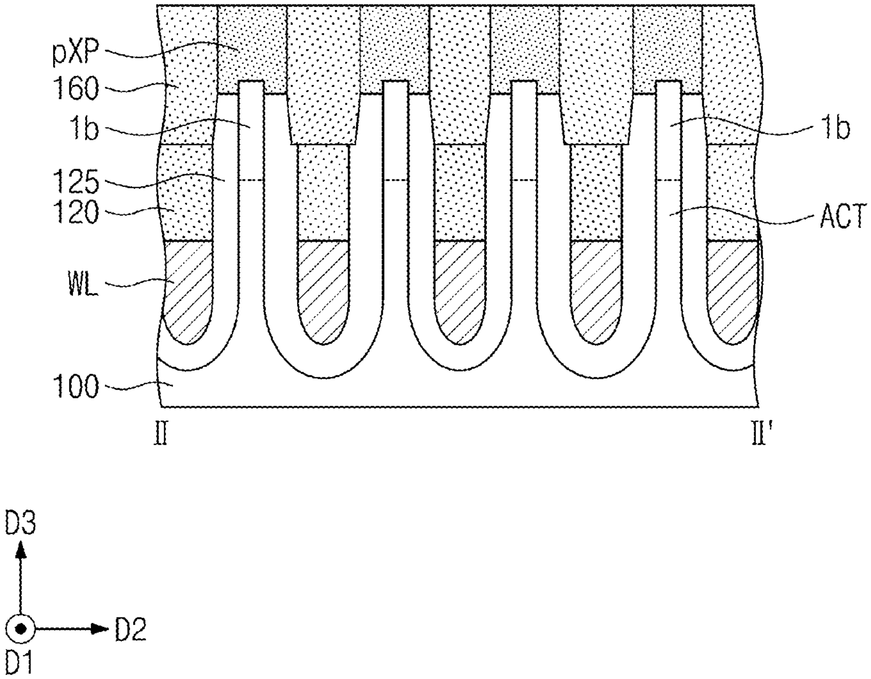

Referring to FIGS. 6A, 6B, and 6C, an upper portion of the device isolation pattern 110 may be selectively removed. A portion of the gate dielectric layer 125 may also be removed during this process. The process of selectively and partially removing the device isolation pattern 110 may be performed using a wet etching process. Accordingly, side surfaces of the active portions ACT may be partially exposed to the outside. In an implementation, the process of selectively removing the upper portion of the device isolation pattern 110 may be omitted.

Thereafter, preliminary pads pXP may be formed on the active portions ACT. The formation of the preliminary pads pXP may include forming a pad conductive layer on the substrate 100 and patterning the pad conductive layer. In an implementation, the formation of the pad conductive layer may include forming a poly-silicon layer and injecting impurities into the poly-silicon layer. In an implementation, the poly-silicon layer may be doped in situ when the poly-silicon layer for the pad conductive layer is formed.

In the case where the upper portion of the device isolation pattern 110 is selectively removed, a portion of each of the preliminary pads pXP may extend into a region lower than a top surface of each of the active portions ACT. First insulating separation patterns 160 may be formed to fill spaces between the preliminary pads pXP.

Figure 7A:
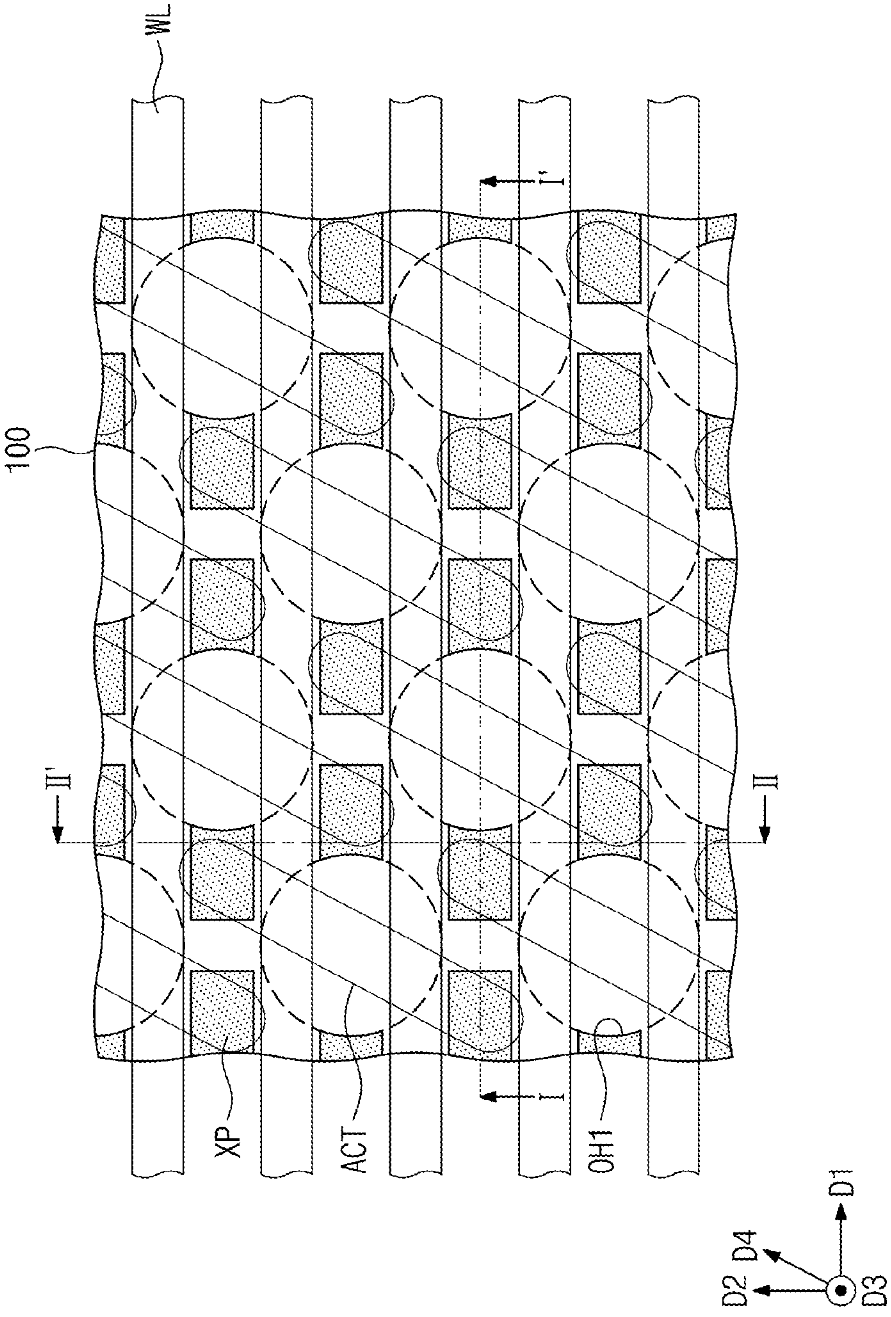
Figure 7B:
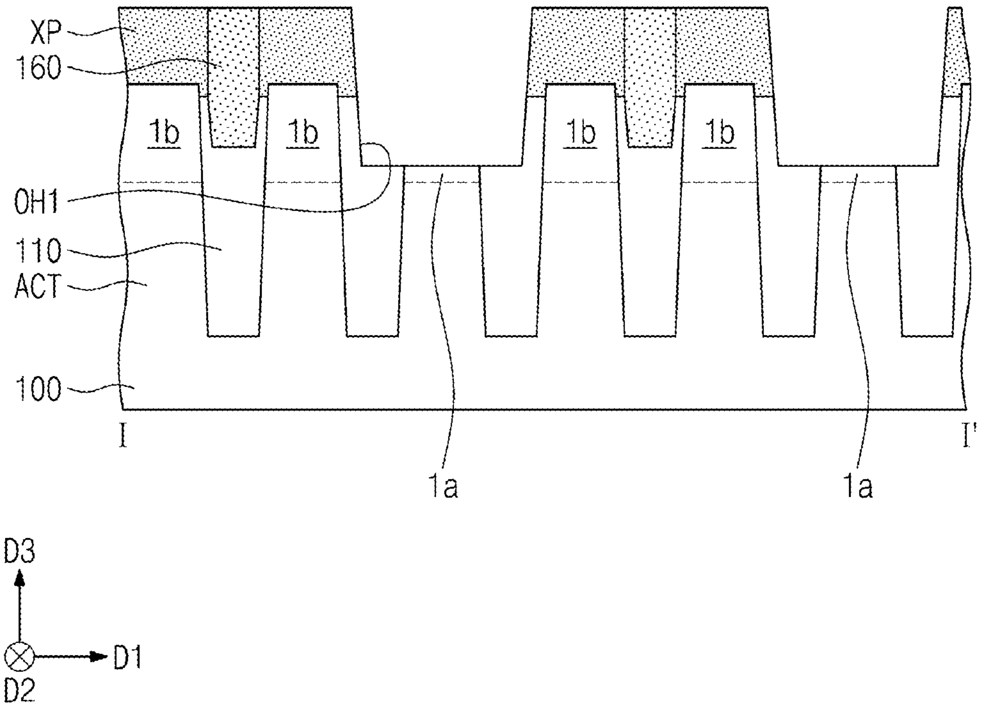

Referring to FIGS. 7A and 7B, a first opening OH1 may be formed on the first impurity region 1*a* of each of the active portions ACT. The first opening OH1 may be formed by etching the first insulating separation patterns 160 and the preliminary pads pXP (e.g., of FIG. 6B) on the active portions ACT. In an implementation, the first impurity region 1*a* may be partially etched by the etching process, and in this case, a level of a top surface of the first impurity region 1*a* may be lowered. Portions of the preliminary pads pXP, which are left after the formation of the first opening OH1, may form first pads XP.

The first opening OH1 may be formed to expose a side surface of each of the first pads XP, top and side surfaces of the device isolation pattern 110, and a top surface of the first impurity region 1*a* of each of the active portions ACT.

Figure 8A:
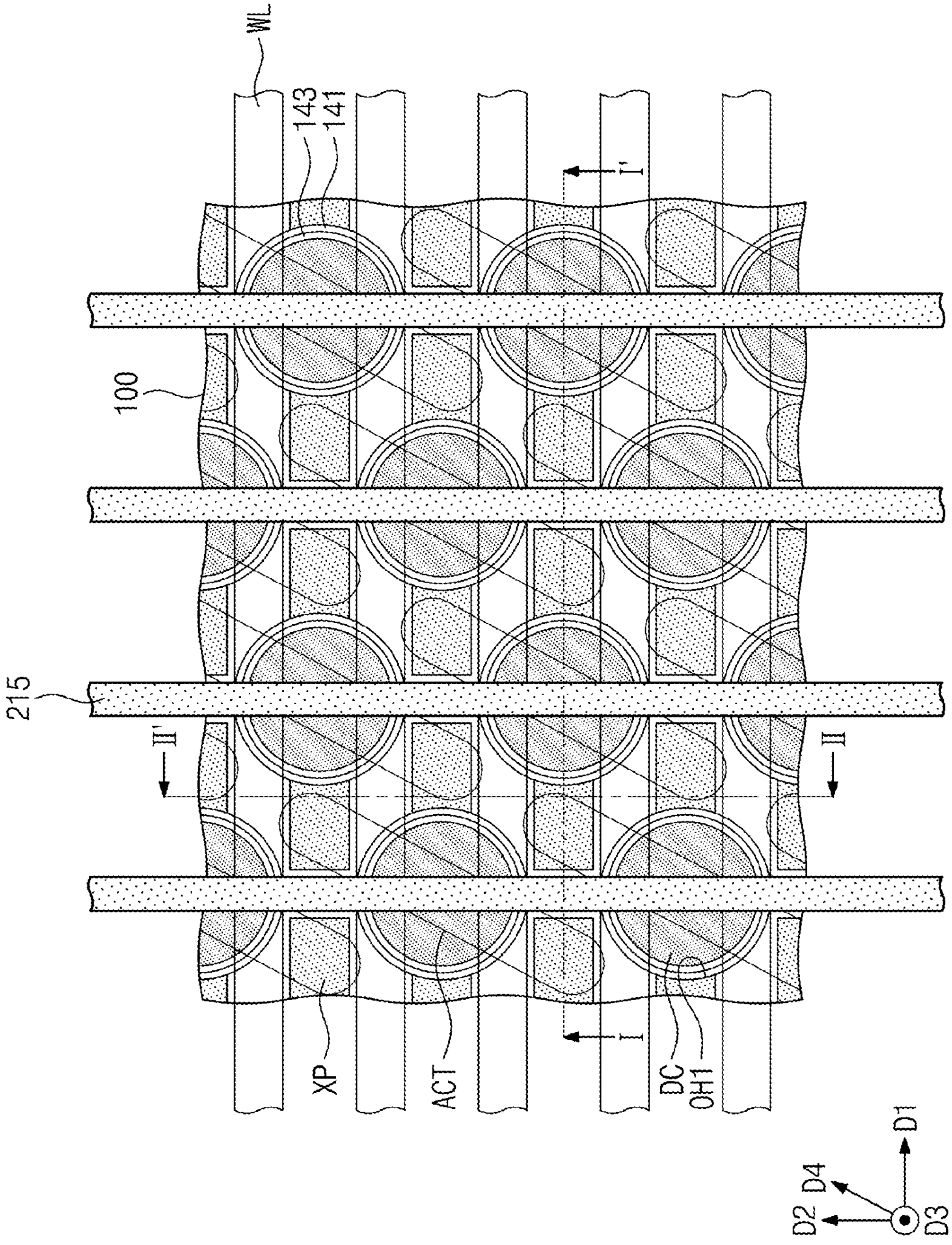
Figure 8B:
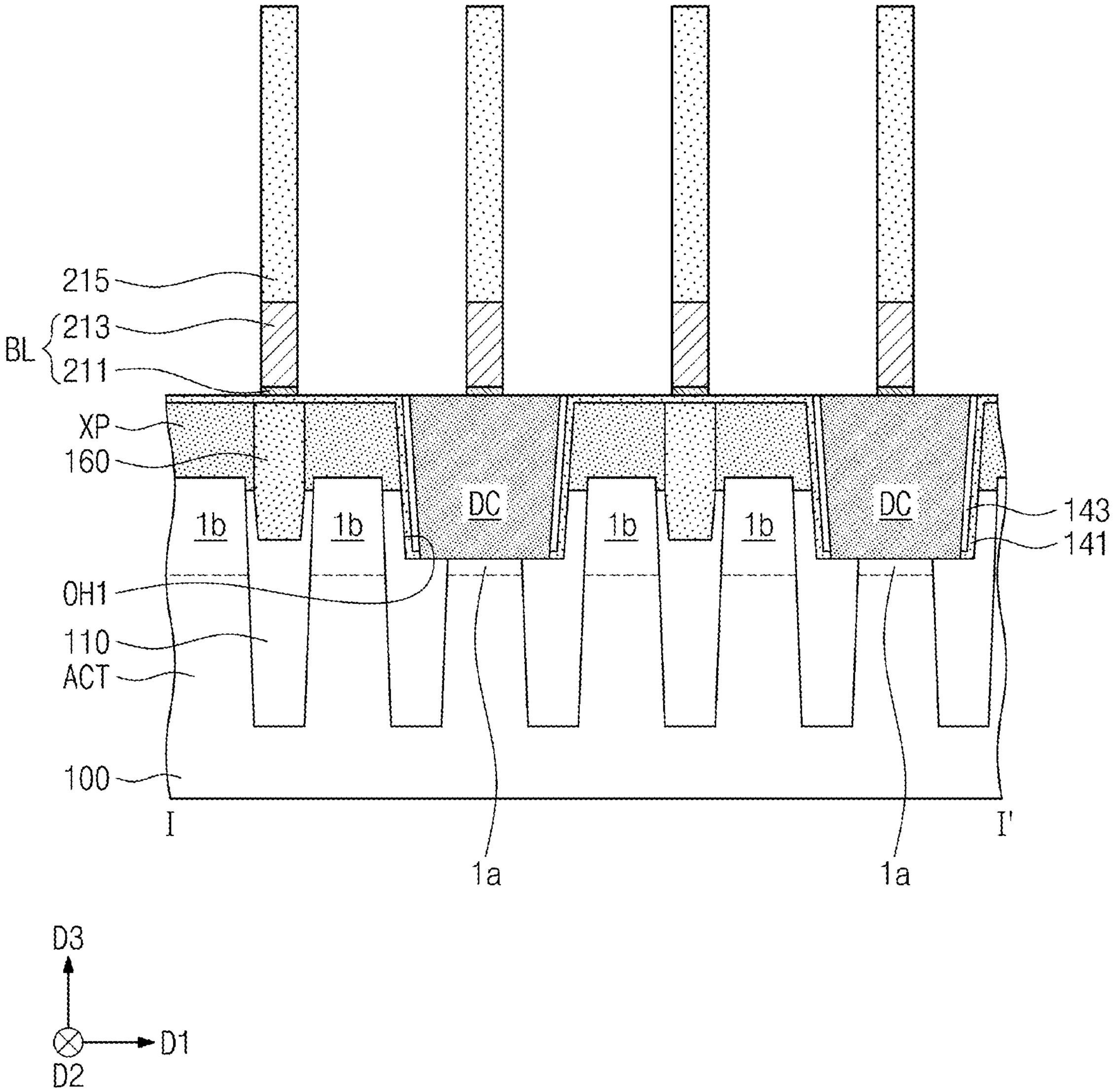

Referring to FIGS. 8A and 8B, a first contact insulating layer 141 may be formed to cover an inner side surface of the first opening OH1, a second contact insulating layer 143 may be formed on a side surface the first contact insulating layer 141, and a first contact DC may be formed to fill a remaining space of the first opening OH1 provided with the first and second contact insulating layers 141 and 143. The first contact insulating layer 141 may extend from the inner side surface of the first opening OH1 to cover top surfaces of the first pads XP and top surfaces of the first insulating separation patterns 160. In addition, the first contact insulating layer 141 may include a portion that extends from the inner side surface of the first opening OH1 to cover at least a portion of a bottom surface of the first opening OH1. The first contact DC may be in contact with the first impurity region 1*a* of each of the active portions ACT. The first and second contact insulating layers 141 and 143 may be formed of different insulating materials from each other. The first contact DC may be formed of or include doped poly silicon.

Bit lines BL may be formed to cross the active portions ACT in the second direction D2 and to be in contact with the first contact DC, and bit line capping patterns 215 may be formed on the bit lines BL, respectively. Each of the bit lines BL may include a first barrier pattern 211 and a first conductive pattern 213, which are sequentially stacked on the first contact insulating layer 141. The formation of the bit lines BL and the bit line capping patterns 215 may include sequentially forming a first barrier layer, a first conductive layer, and a bit line capping layer on the first contact DC and the first contact insulating layer 141, forming a mask pattern on the bit line capping layer, patterning the first barrier layer, the first conductive layer, and the bit line capping layer using the mask pattern as an etch mask, and removing the mask pattern.

Figure 9:
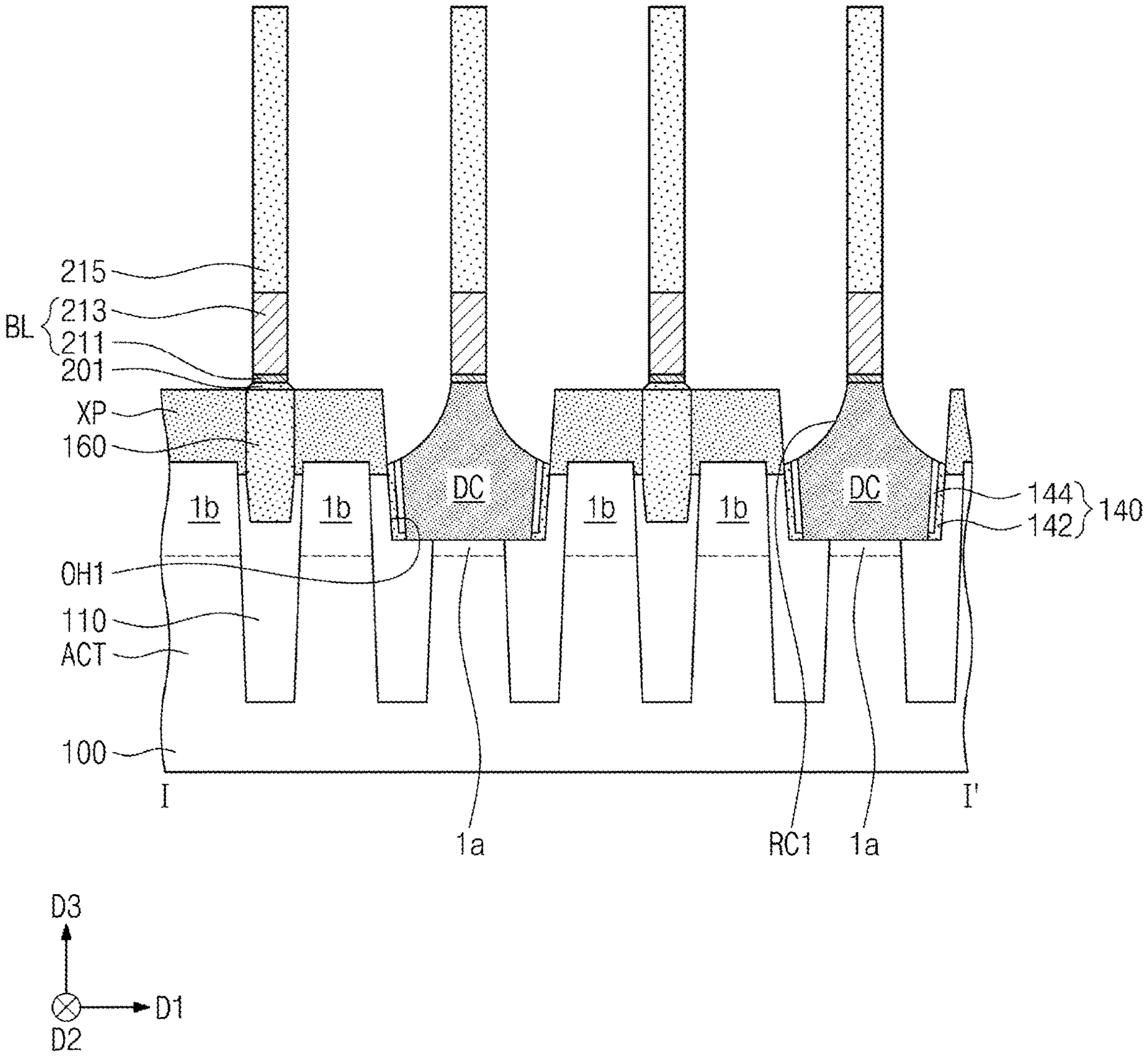

Referring to FIGS. 8B and 9, the first contact insulating layer 141 on the first pads XP may be removed. Next, a first recess portion RC1 may be formed by partially etching the first and second contact insulating layers 141 and 143 and the first contact DC in the first opening OH1. First and second contact insulating patterns 142 and 144 constituting a contact insulating structure 140 may be respectively formed as a result of the partially etching of the first and second contact insulating layers 141 and 143. The first recess portion RC1 may be formed to expose a side surface of each of the first pads XP, a top surface of the contact insulating structure 140, and a side surface of the first contact DC.

Figure 10:
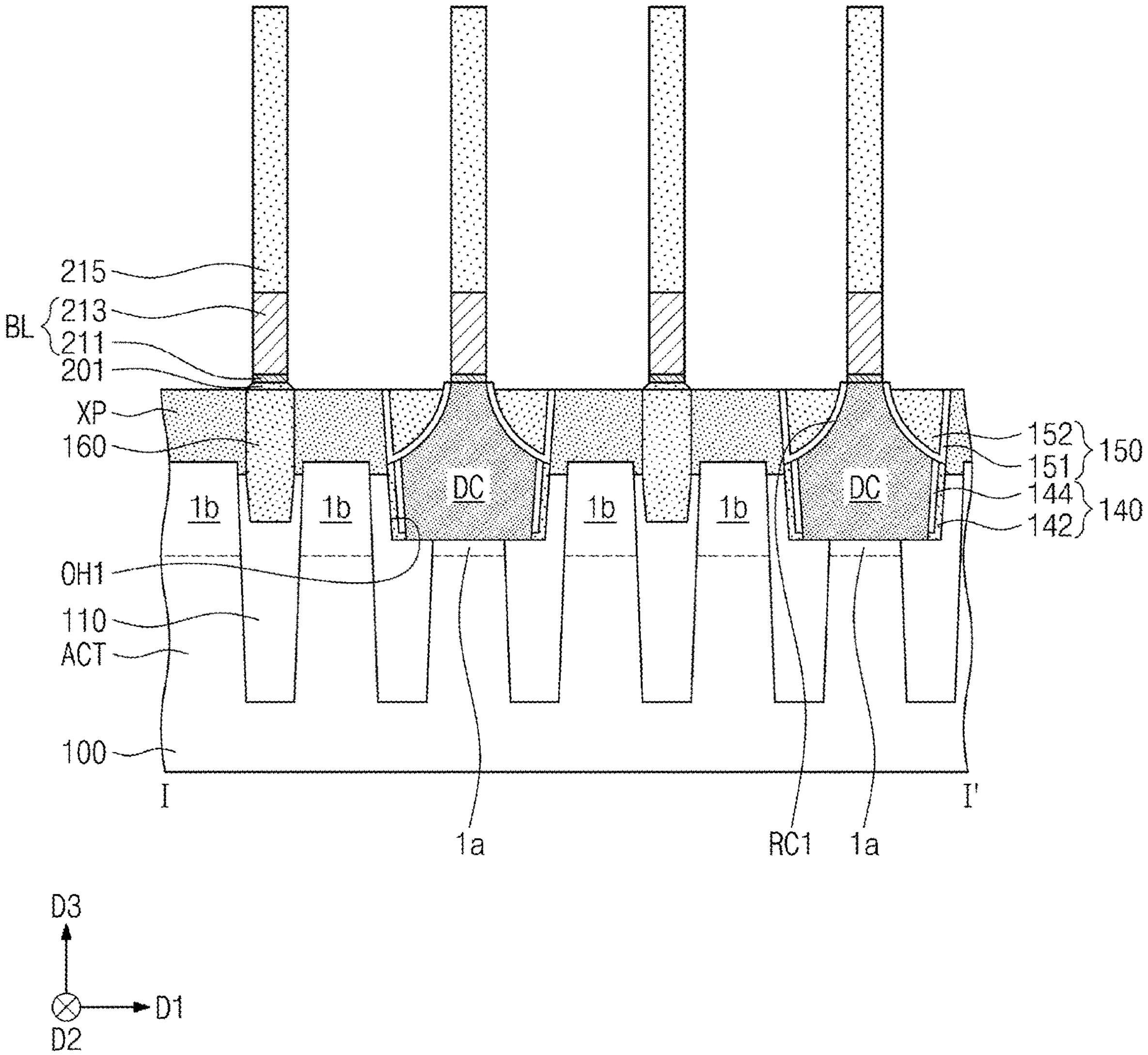

Referring to FIG. 10, a gapfill insulating structure 150 may be formed to fill the first recess portion RC1. The formation of the gapfill insulating structure 150 may include forming a first insulating gapfill layer to conformally cover the first recess portion RC1, forming a second insulating gapfill layer on the first insulating gapfill layer (e.g., using a deposition process) to fill the first recess portion RC1, and etching the first and second insulating gapfill layers to be locally left in the first recess portion RC1. As a result of the etching of the first and second insulating gapfill layers, first and second gapfill insulating patterns 151 and 152 may be formed in the first recess portion RC1. After the etching of the first and second insulating gapfill layers, portions of the first contact insulating layer 141 may be left between the bit lines BL and the first insulating separation patterns 160, and such left portions may form buffer insulating patterns 201.

Figure 11A:
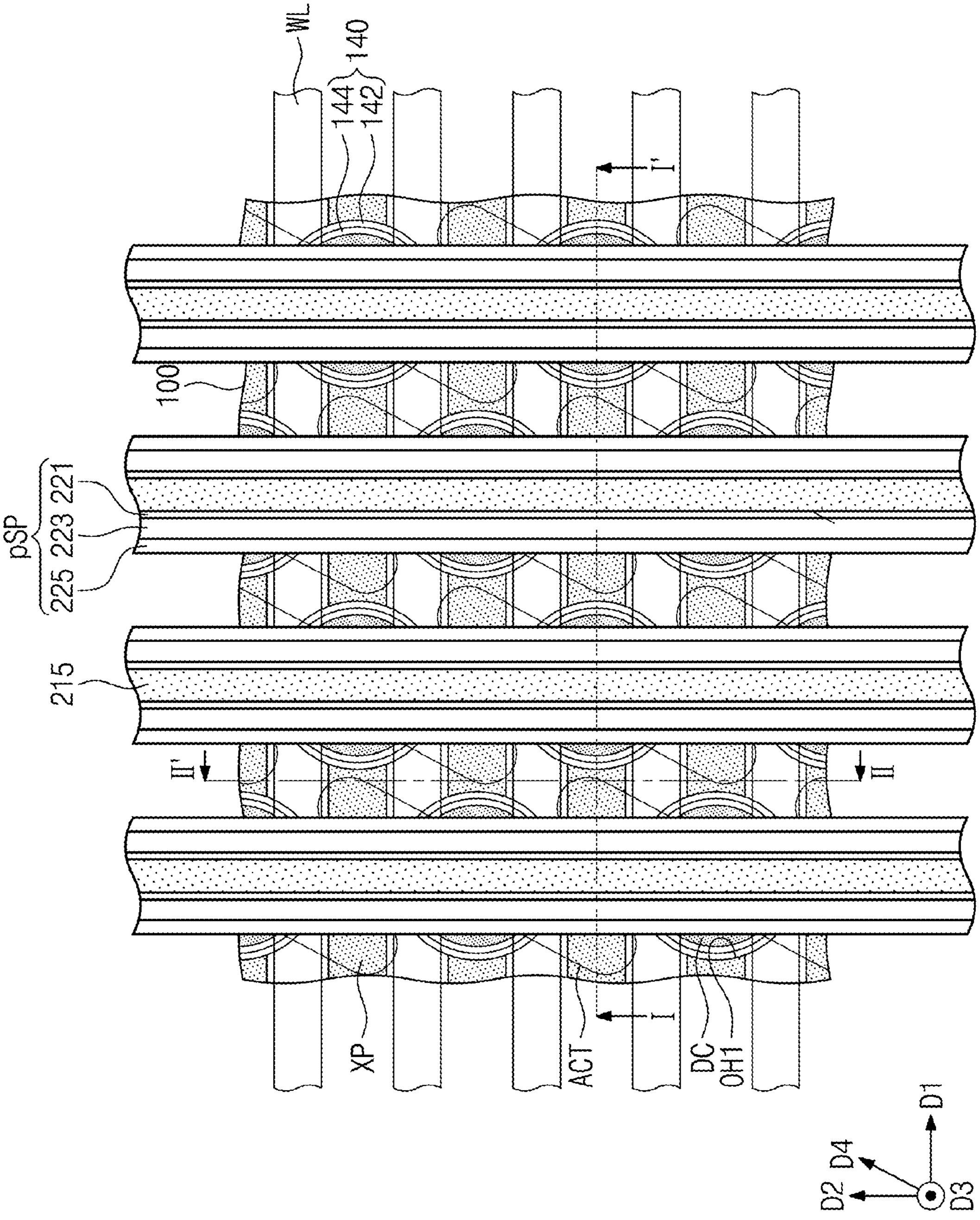
Figure 11B:
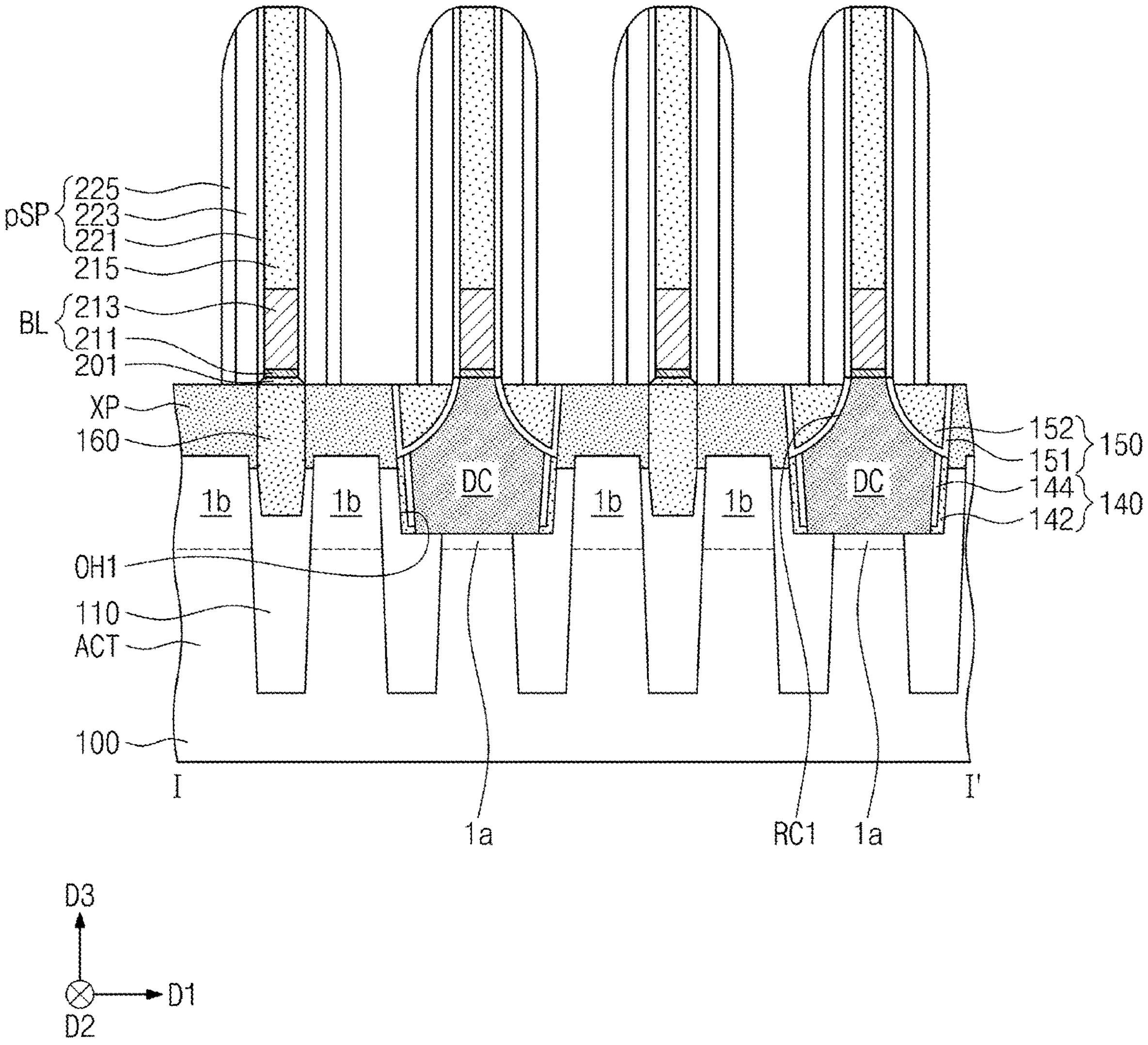

Referring to FIGS. 11A and 11B, preliminary bit line spacers pSP may be formed to cover the side surfaces of the bit lines BL and the side surfaces of the bit line capping patterns 215. The formation of the preliminary bit line spacers pSP may include sequentially forming first to third spacers 221, 223, and 225 on the side surfaces of the bit lines BL and the side surfaces of the bit line capping patterns 215. Adjacent ones of the first to third spacers 221, 223, and 225 may be formed of or include different insulating materials from each other. In an implementation, the second spacer 223 may be formed of or include an insulating material having an etch selectivity with respect to the first and third spacer 221 and 225. The first spacer 221 may have a bottom surface that is in contact with the first gapfill insulating pattern 151 and each of the buffer insulating patterns 201. The bottom surfaces of the second and third spacers 223 and 225 may be in contact with the top surface of each of the first pads XP.

Figure 12A:
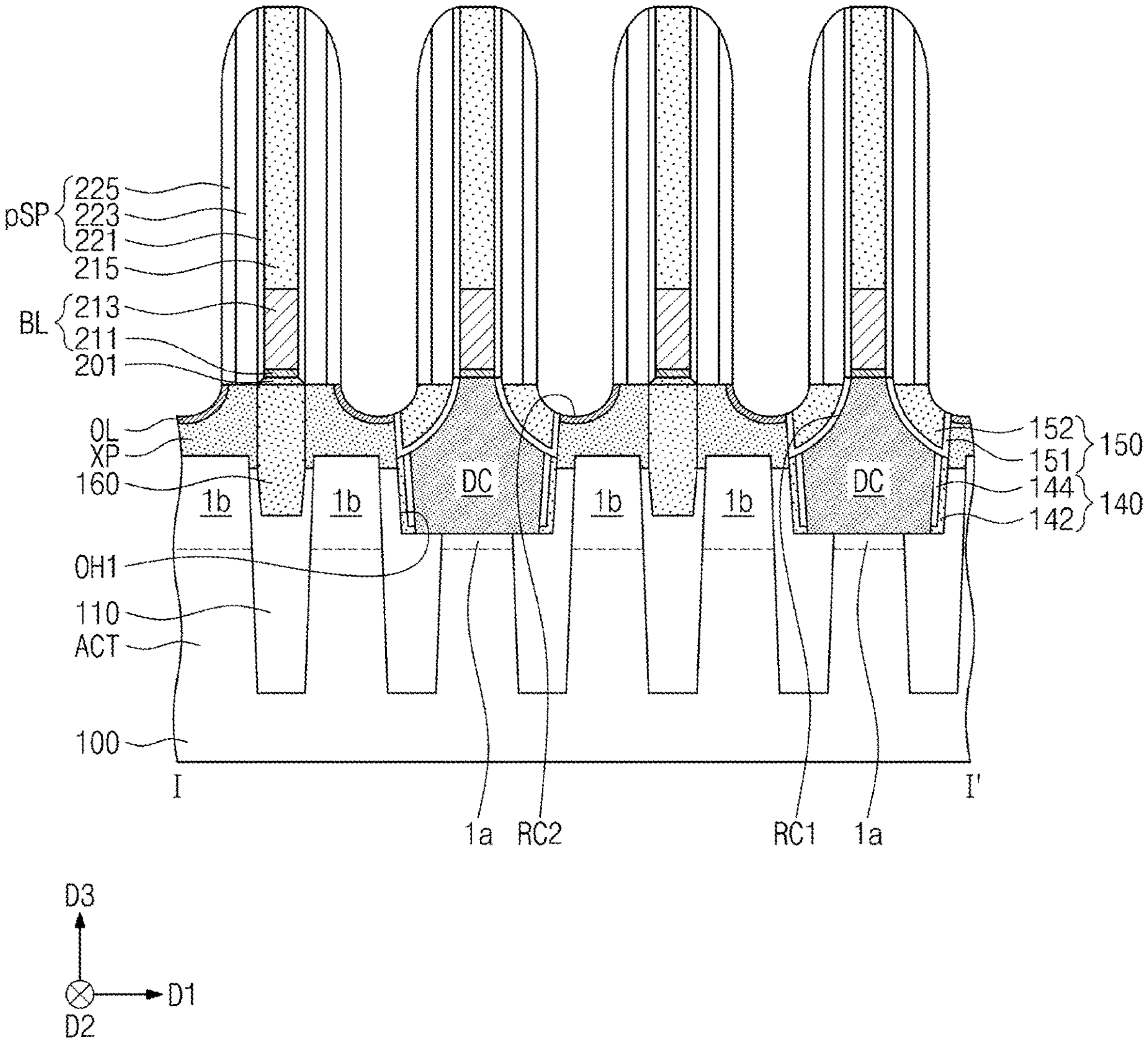
Figure 12B:
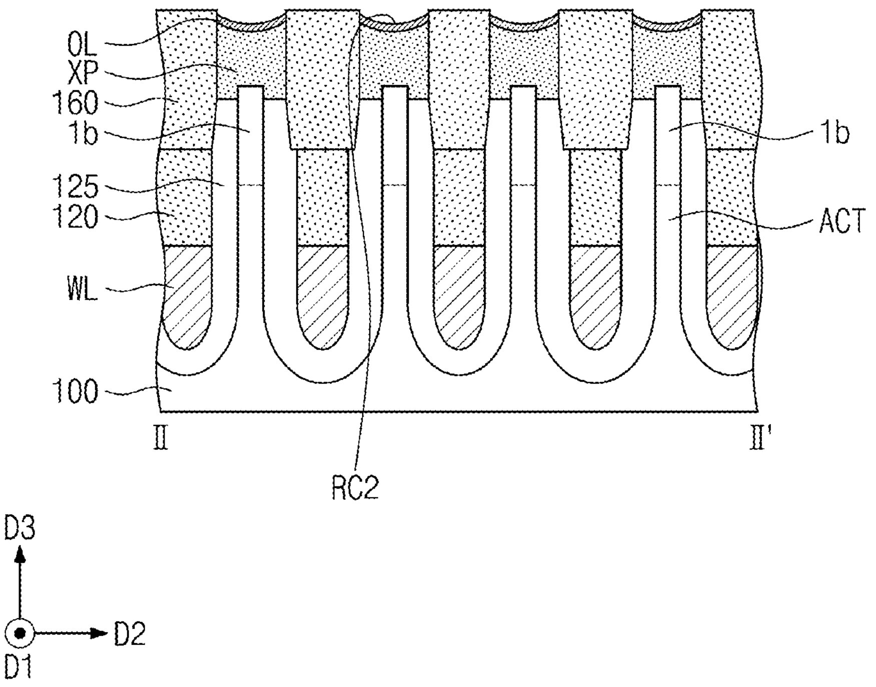

Referring to FIGS. 12A and 12B, second recess portions RC2 may be formed by partially etching the first pads XP and the gapfill insulating structures 150. Next, an ohmic contact layer OL may be formed in an upper portion of the first pad XP exposed by the second recess portion RC2. The ohmic contact layer OL may be formed of or include a metal silicide (e.g., cobalt silicide).

Figure 13A:
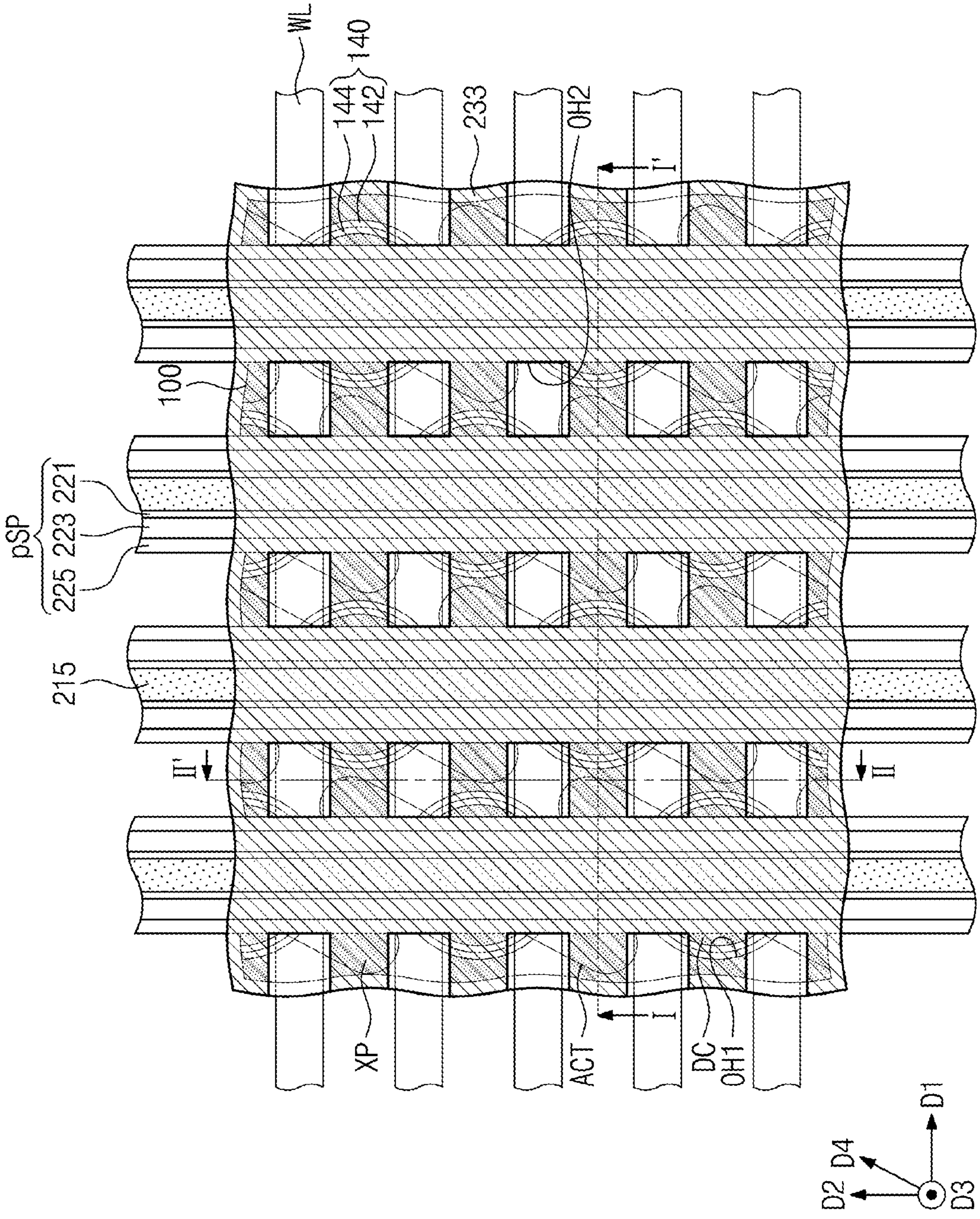
Figure 13B:
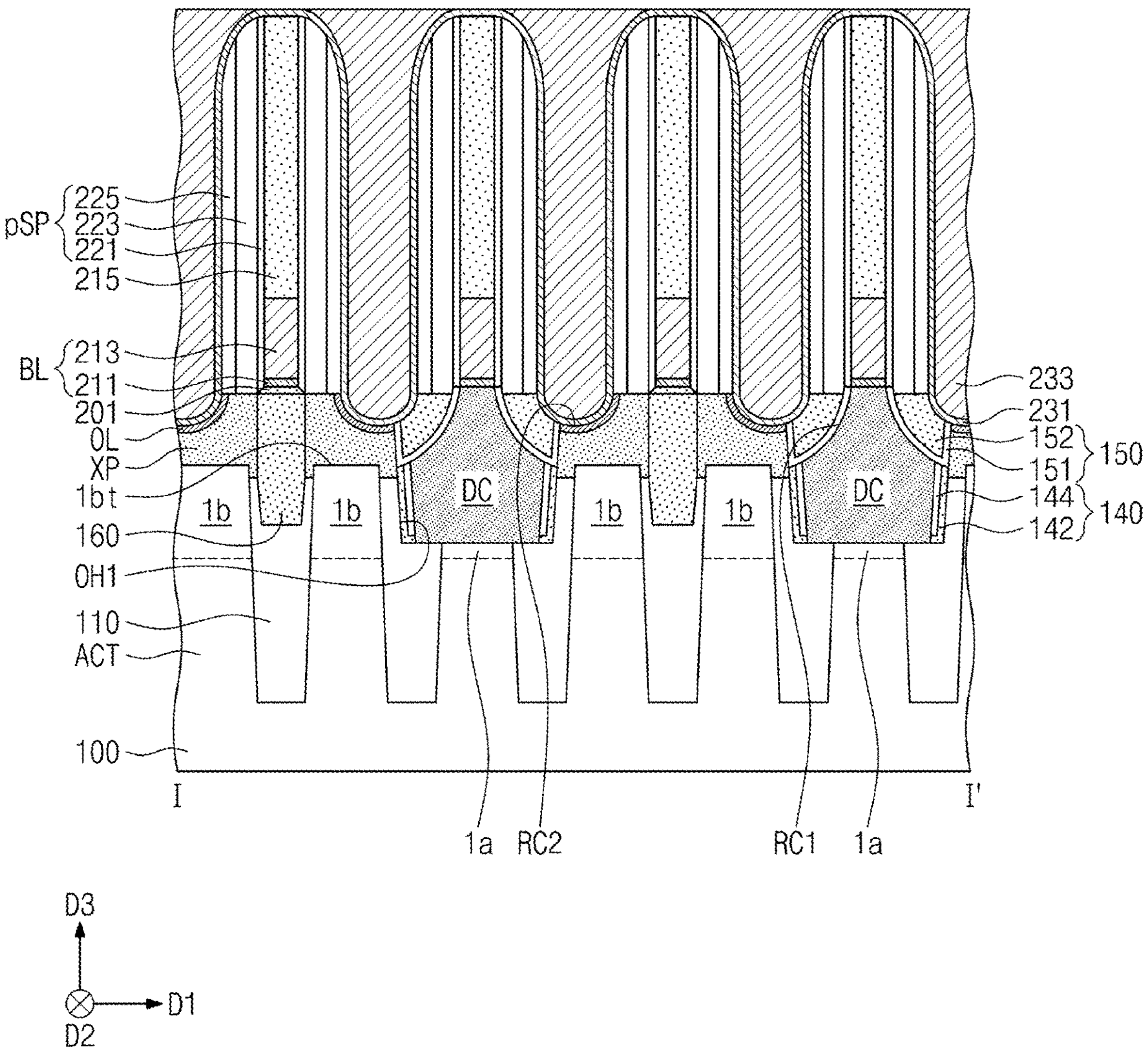
Figure 13C:
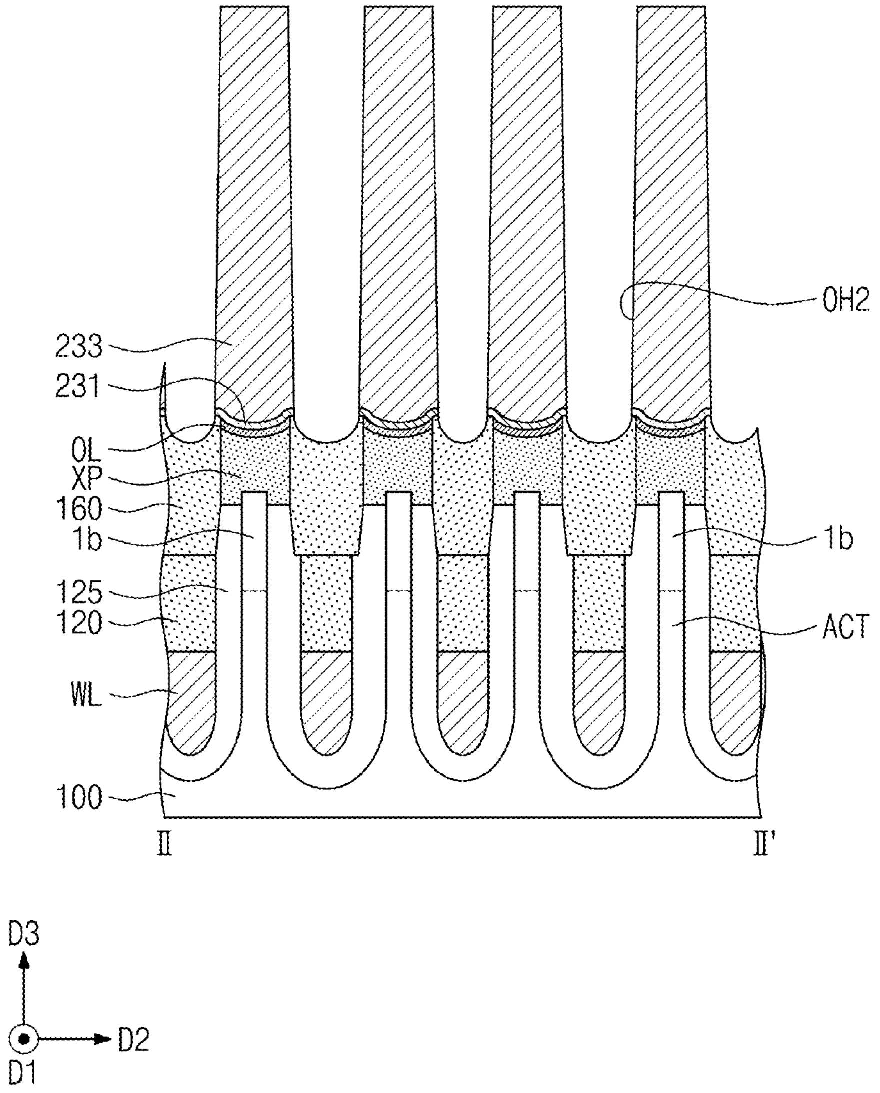
Figure 14A:
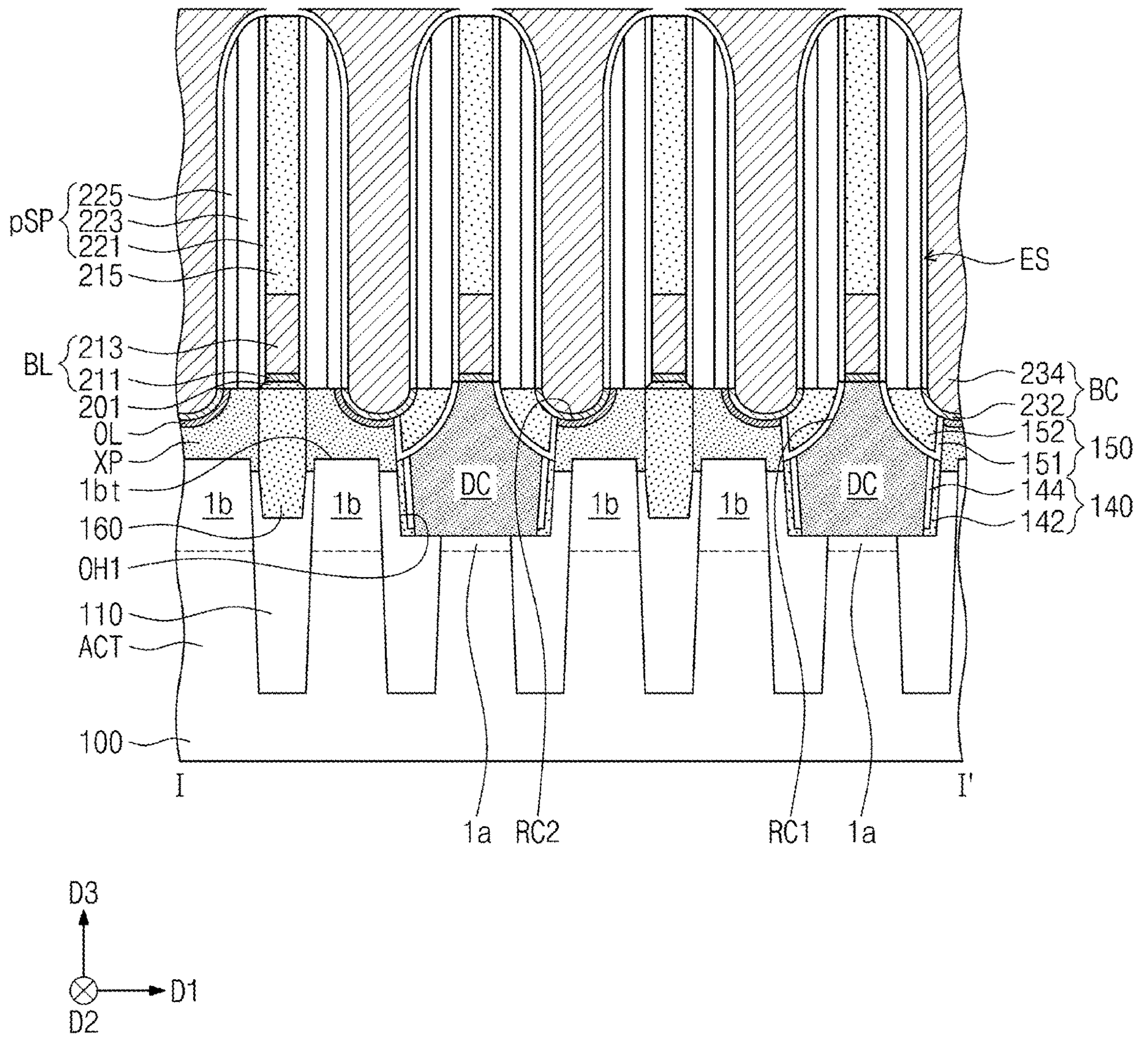
Figure 14B:
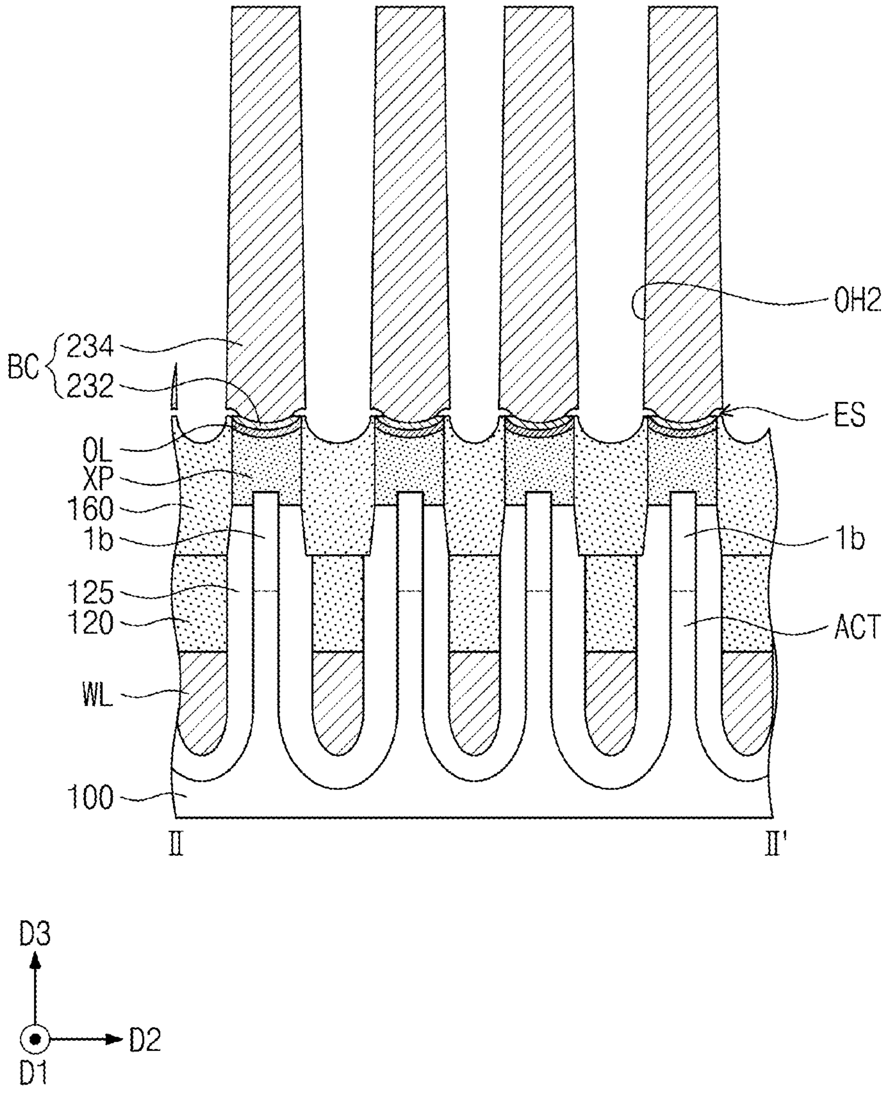
Figure 15A:
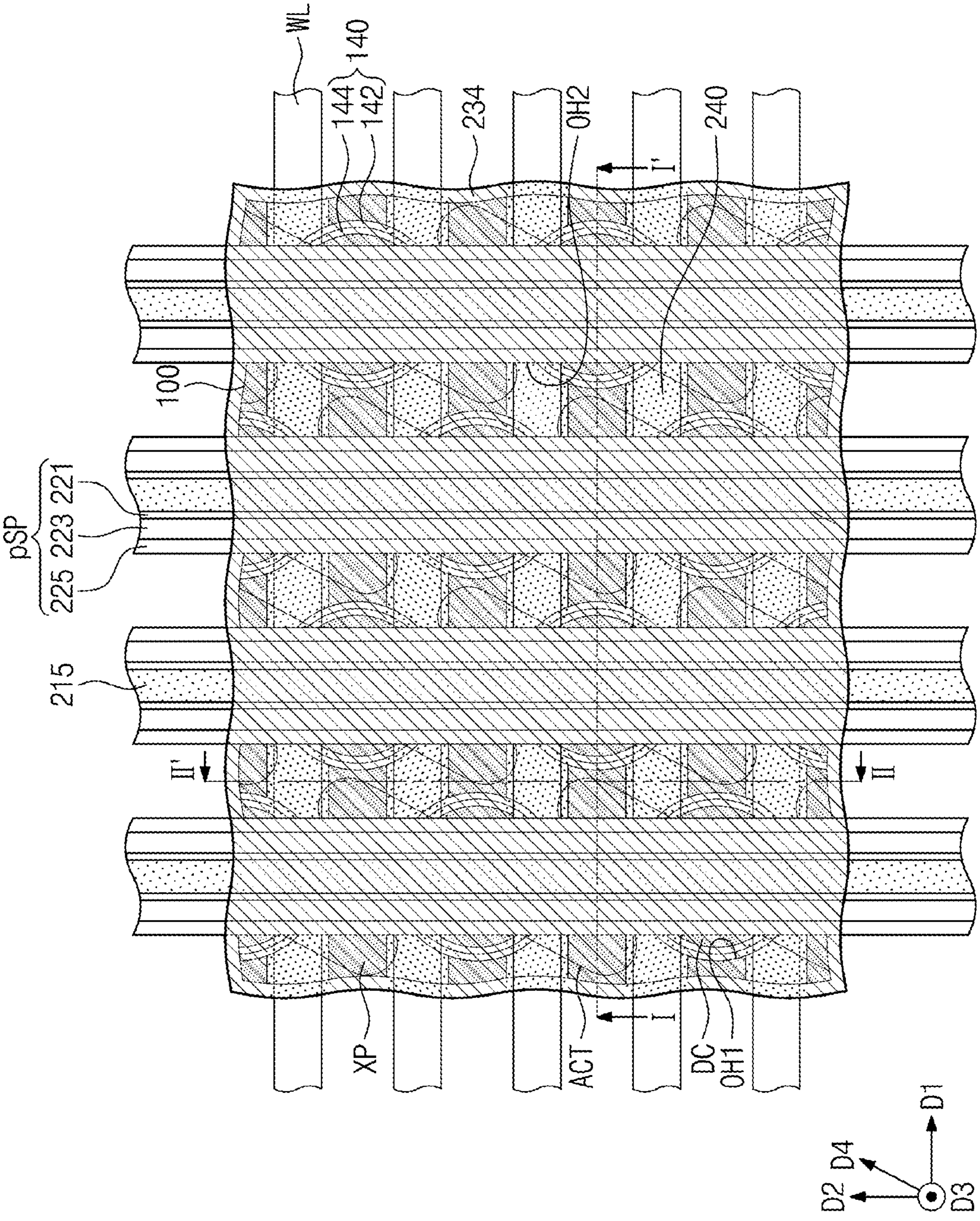
Figure 15B:
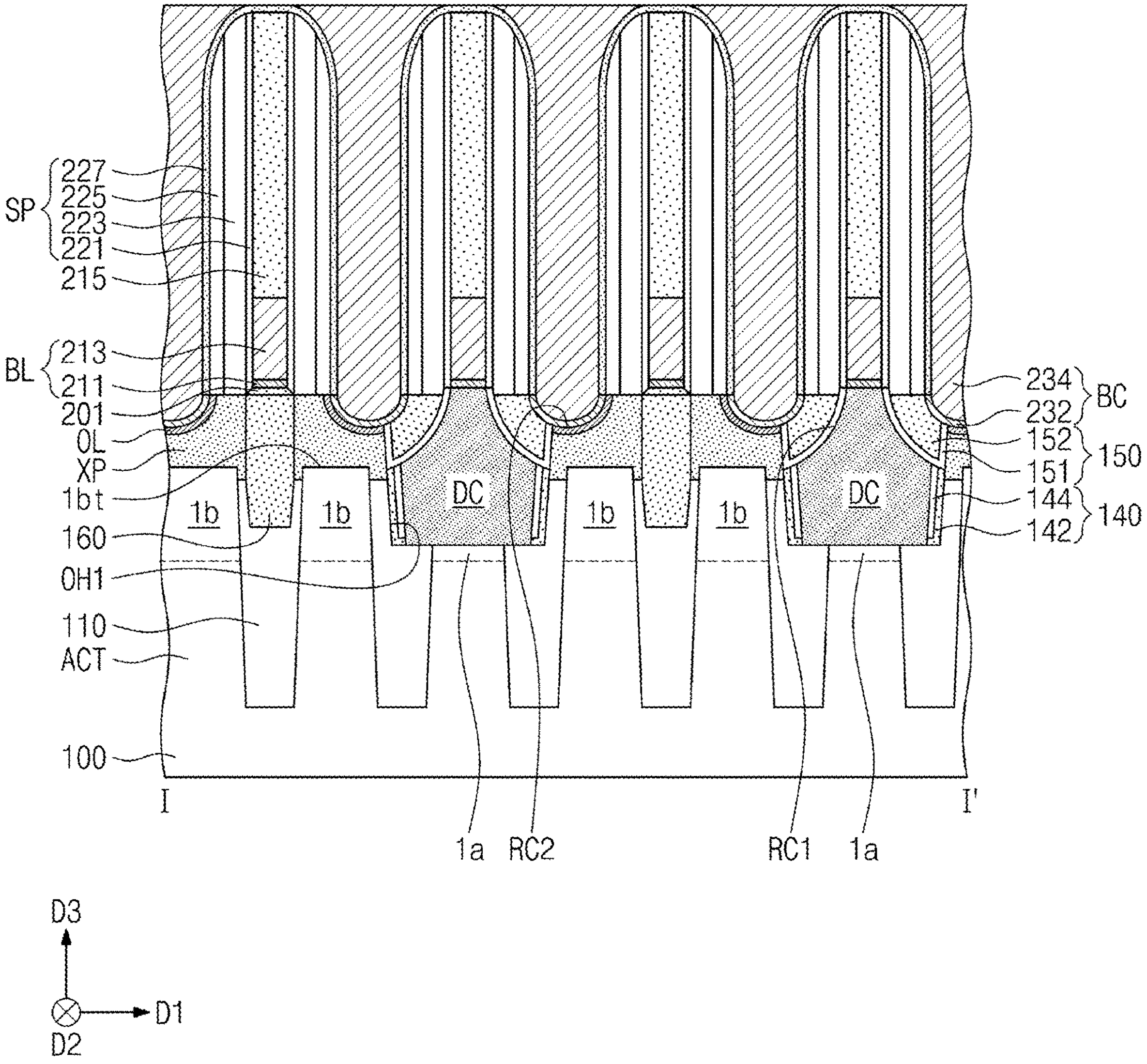
Figure 15C:
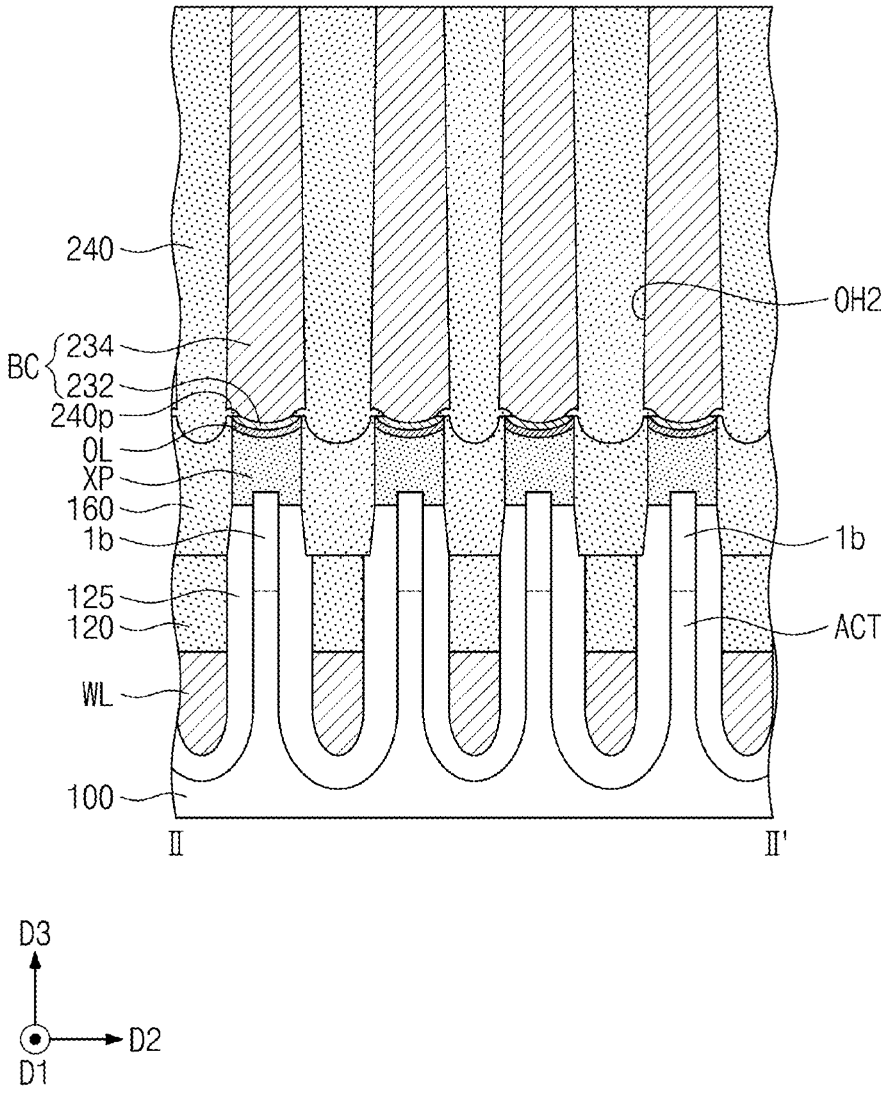

Referring to FIGS. 13A, 13B, and 13C, a second barrier layer 231 and a second conductive layer 233 may be formed to fill a space between the second recess portion RC2 and the bit lines BL. The second barrier layer 231 may cover a top surface of the ohmic contact layer OL, a top surface of the gapfill insulating structure 150, top and side surfaces of the third spacer 225, top surfaces of the first and second spacers 221 and 223, and a top surface of each of the bit line capping patterns 215. The second conductive layer 233 may be formed on the second barrier layer 231 and may fully fill the space between the second recess portion RC2 and the bit lines BL. In an implementation, the second conductive layer 233 may be formed to have a top surface, which is located at a level higher than the uppermost surface of the second barrier layer 231.

Thereafter, second openings OH2 may be formed between the bit lines BL and on regions, which are overlapped with the word lines WL in a third direction D3 (i.e., vertically). The formation of the second openings OH2 may include forming a mask pattern on the second conductive layer 233 and etching the second conductive layer 233, the second barrier layer 231, and at least a portion of each of the first insulating separation patterns 160 using the mask pattern as an etch mask. A top surface of each of the first insulating separation patterns 160, side surfaces of the second barrier layer 231, and side surfaces of the second conductive layer 233 may be exposed to the outside through the second openings OH2.

Referring to FIGS. 13B, 13C, 14A, and 14B, a portion of the second barrier layer 231, which is exposed through the second openings OH2, may be selectively removed to form an empty space ES. In an implementation, a portion of the second barrier layer 231, which is located at a level higher the bottom surfaces of the bit lines BL and the bottom surfaces of the preliminary bit line spacers pSP, may be selectively removed. A remaining portion of the second barrier layer 231, which is not removed by the selective removal process, may form a second barrier pattern 232. In addition, a planarization process may be performed to remove an upper portion of the second conductive layer 233, and a remaining portion of the second conductive layer 233, which is not removed by the planarization process, may form a second conductive pattern 234. The second barrier pattern 232 and the second conductive pattern 234 may form a second contact BC. The empty space ES may extend from the top surface of the second barrier pattern 232 along the side surface of the second conductive pattern 234, when viewed in the sectional view of FIG. 14A. In addition, the empty space ES may include a space, which is recessed inward from the side surface of the second conductive pattern 234, when viewed in the sectional view of FIG. 14B.

Referring to FIGS. 14A, 14B, 15A, 15B, and 15C, second insulating separation patterns 240 may be formed to fill the second openings OH2. A planarization process may be performed on the second insulating separation patterns 240, and in this case, the second insulating separation patterns 240 may be formed to have top surfaces that are substantially coplanar with the top surfaces of the second contacts BC.

When the second insulating separation patterns 240 are formed, a fourth spacer 227 may also be formed to fill the empty space ES. The fourth spacer 227 may cover the side and top surfaces of the third spacer 225, the top surfaces of the first and second spacers 221 and 223, and the top surface of each of the bit line capping patterns 215. The first to fourth spacers 221, 223, 225, and 227 may constitute the bit line spacers SP that are in contact with the second contacts BC. In addition, protruding portions 240*p* of each of the second insulating separation patterns 240 may be formed to fill portions of the empty space ES, which are recessed inward from the side surface of the second conductive pattern 234.

Referring back to FIGS. 1A, 1B, and 1C, second pads LP may be formed on the second contacts BC, respectively, and third insulating separation patterns LPS may be formed between the second pads LP. In an implementation, a third barrier layer and a third conductive layer may be sequentially formed on the second contacts BC and the second insulating separation patterns 240. Here, the third insulating separation pattern LPS may be formed to penetrate the third barrier layer and the third conductive layer, and as a result, the second pad LP including a third barrier pattern 301 and a third conductive pattern 303 may be formed. Thereafter, data storage patterns DSP may be formed on the second pads LP, respectively.

By way of summation and review, to increase the integration density of the semiconductor device, linewidths of patterns constituting the semiconductor device may be reduced. Novel and expensive exposure technologies may be used to reduce the linewidths of the patterns, and it may be difficult to increase the integration density of the semiconductor device. Recently, a variety of new technologies are being studied to increase an integration density of a semiconductor memory device.

In a semiconductor device according to an embodiment, a second contact (e.g., a storage node contact) may include a second barrier pattern which is locally provided at a level lower than bottom surfaces of bit lines. In this case, it may be possible to reduce a parasitic capacitance between the bit lines, without a reduction in a contact area of the second contact and a first pad, and thereby to improve electrical characteristics and reliability of the semiconductor device.

In a method of fabricating a semiconductor device according to an embodiment, second insulating separation patterns (e.g., pillar-shaped insulating patterns which are between the bit lines and on a region overlapped with word lines) may be formed after the formation of the second contacts. Accordingly, it may be possible to prevent or suppress a bridge pattern (e.g., a short circuit) from being formed between the second contacts and thereby to improve the electrical characteristics and reliability of the semiconductor device.

One or more embodiments may provide a semiconductor device with improved electrical characteristics and reliability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:

a substrate including an active portion defined by a device isolation pattern;

a word line in the substrate, the word line crossing the active portion and extending lengthwise in a first direction;

a bit line crossing the active portion and the word line and extending lengthwise in a second direction intersecting the first direction;

a first pad on an end portion of the active portion;

a contact on the first pad and adjacent to the bit line in the first direction; and an insulating separation pattern on the word line and in physical contact with a side surface of a lower end portion of the contact in the second direction, wherein:

the contact includes:

a barrier pattern on the first pad, and a conductive pattern vertically extending from the barrier pattern, and a side surface of the conductive pattern of the contact is in direct contact with the insulating separation pattern.

2. The semiconductor device as claimed in claim 1, further comprising a bit line spacer covering a side surface of the bit line, wherein the bit line spacer is in direct contact with the conductive pattern of the contact.

3. The semiconductor device as claimed in claim 2, wherein:

the bit line spacer includes a first spacer, a second spacer, a third spacer, and a fourth spacer, which are sequentially stacked on the side surface of the bit line, the second spacer and the third spacer vertically extend from a top surface of the first pad, and the fourth spacer is in contact with the barrier pattern of the contact and vertically extends along the side surface of the conductive pattern of the contact.

4. The semiconductor device as claimed in claim 3, wherein the first spacer and the third spacer each include an insulating material different from the second spacer.

5. The semiconductor device as claimed in claim 4, wherein:

the first spacer and the third spacer each include silicon nitride, and the second spacer includes silicon oxide.

6. The semiconductor device as claimed in claim 3, wherein the fourth spacer includes silicon oxide, silicon nitride, or silicon oxycarbide.

7. The semiconductor device as claimed in claim 3, wherein at least one of the second spacer and the fourth spacer is an air layer or an air gap.

8. The semiconductor device as claimed in claim 1, wherein the semiconductor device comprises a plurality of contacts, wherein the contact is a second contact of the plurality of contacts, the plurality of contacts further comprising a first contact on a center portion of the active portion and connected to the bit line, wherein the first contact is spaced apart from the first pad in the first direction.

9. The semiconductor device as claimed in claim 8, further comprising:
- a contact insulating structure between the first contact and the device isolation pattern; and
- a gapfill insulating structure between the first contact and the first pad,
- wherein:
- the first contact includes:
  - a first portion, which has an increasing width with increasing distance from the substrate, and
  - a second portion on the first portion, the second portion having a decreasing width with increasing distance from the substrate,
- the first portion of the first contact is surrounded by the contact insulating structure, and
- the second portion of the first contact is surrounded by the gapfill insulating structure.

10. The semiconductor device as claimed in claim 1, wherein a bottom surface of the insulating separation pattern is at a level lower than a bottom surface of the contact.

11. The semiconductor device as claimed in claim 1, wherein:
- the insulating separation pattern includes a protruding portion protruding toward the contact, and
- the protruding portion is in contact with the barrier pattern of the contact.

12. The semiconductor device as claimed in claim 1, wherein:
- the insulating separation pattern includes:
  - a first portion extending along the side surface of the conductive pattern of the contact, and
  - a second portion below the first portion and in contact with the barrier pattern of the contact, and
- a width of the second portion in the second direction is smaller than a width of the first portion in the second direction.

13. The semiconductor device as claimed in claim 1, further comprising an ohmic contact layer between the first pad and the contact,
- wherein the ohmic contact layer includes a metal silicide.

14. A semiconductor device, comprising:
- a substrate including an active portion defined by a device isolation pattern;
- a word line in the substrate, the word line crossing the active portion and extending lengthwise in a first direction;
- a bit line crossing the active portion and the word line and extending lengthwise in a second direction intersecting the first direction;
- a bit line spacer covering a side surface of the bit line;
- a first contact on a center portion of the active portion and connected to the bit line;
- a first pad on an end portion of the active portion and spaced apart from the first contact in the first direction;
- a second contact on the first pad and adjacent to the bit line in the first direction;
- an ohmic contact layer between the first pad and the second contact;
- an insulating separation pattern on the word line and in physical contact with a side surface of a lower end portion of the second contact in the second direction;
- a second pad on the second contact; and
- a data storage pattern on the second pad,
- wherein:
- the bit line spacer includes a first spacer, a second spacer, a third spacer, and a fourth spacer sequentially stacked on the side surface of the bit line,
- the second contact includes:
  - a barrier pattern on the first pad, and
  - a conductive pattern vertically extending from the barrier pattern, and
- a first side surface of the conductive pattern of the second contact is in direct contact with the fourth spacer of the bit line spacer and a second side surface of the conductive pattern of the second contact is in direct contact with the insulating separation pattern.

15. The semiconductor device as claimed in claim 14, wherein:
- the second spacer and the third spacer vertically extend from a top surface of the first pad, and
- the fourth spacer is in contact with the barrier pattern of the second contact and vertically extends along the first side surface of the conductive pattern of the second contact.

16. The semiconductor device as claimed in claim 15, wherein adjacent ones of the first spacer, the second spacer, the third spacer, and the fourth spacer include different insulating materials from each other.

17. The semiconductor device as claimed in claim 15, wherein at least one of the second spacer and the fourth spacer is an air layer or an air gap.

18. A method of fabricating a semiconductor device, the method comprising:
- forming a device isolation pattern on a substrate to define active portions;
- forming word lines in the substrate to cross the active portions and to extend lengthwise in a first direction;
- forming first pads on the active portions;
- partially etching the active portions and the first pads to form a first opening;
- forming a first contact in the first opening;
- forming bit lines to cross the active portions and the word lines and to extend lengthwise in a second direction intersecting the first direction;
- sequentially forming a first spacer, a second spacer, and a third spacer on side surfaces of each of the bit lines;
- forming second contacts between the bit lines and between the word lines, the second contacts being in contact with the first pads; and
- forming insulating separation patterns between the second contacts,
- wherein:
- each of the second contacts includes:
  - a barrier pattern formed on each of the first pads, and
  - a conductive pattern formed on the barrier pattern, and
- side surfaces of the conductive pattern of each of the second contacts are in direct contact with a corresponding one of the insulating separation patterns, and wherein the corresponding one of the insulating separation patterns is in physical contact with a side surface of a lower portion of each of the second contacts in the second direction.

19. The method as claimed in claim 18, wherein:

forming the second contacts and forming the insulating separation patterns include:

forming a barrier layer and a conductive layer to fill a space between adjacent two of the bit lines, the conductive layer being provided on the barrier layer;

forming second openings by partially etching each of the barrier layer and the conductive layer, wherein the second openings are vertically overlapped with the word lines;

selectively removing portions of the barrier layer to form empty spaces at a level higher than a bottom surfaces of each of the bit lines, through the second openings; and filling an insulating material in the second openings and the empty spaces to form the insulating separation patterns, and the barrier pattern and the conductive pattern of each of the second contacts are formed by the forming of the second openings and the selective removal of the portions of the barrier layer.

20. The method as claimed in claim 19, wherein:

filling the insulating material in the empty spaces includes forming a fourth spacer on the third spacer, and side surfaces of the conductive pattern of each of the second contacts are in direct contact with the fourth spacer.

* * * * *